United States Patent
Bae et al.

(10) Patent No.: US 11,251,408 B2
(45) Date of Patent: Feb. 15, 2022

(54) DISPLAY DEVICE WITH ROOF LAYER

(71) Applicant: Samsung Display Co., Ltd., Yongin-si (KR)

(72) Inventors: Kwangsoo Bae, Yongin-si (KR); Beomsoo Park, Yongin-si (KR); Minjeong Oh, Yongin-si (KR); Youngje Cho, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 40 days.

(21) Appl. No.: 16/782,736

(22) Filed: Feb. 5, 2020

(65) Prior Publication Data

US 2020/0350517 A1 Nov. 5, 2020

(30) Foreign Application Priority Data

May 2, 2019 (KR) .......................... 10-2019-0051823

(51) Int. Cl.
*H01L 51/52* (2006.01)

(52) U.S. Cl.
CPC ...... *H01L 51/5275* (2013.01); *H01L 51/5253* (2013.01)

(58) Field of Classification Search
USPC ............................................................. 257/79
See application file for complete search history.

(56) References Cited

U.S. PATENT DOCUMENTS

| 8,264,426 | B2 | 9/2012 | Chung |
| 2009/0079336 | A1 | 3/2009 | Yamada et al. |
| 2010/0090595 | A1* | 4/2010 | Nomura ........... B29D 11/00596 313/506 |
| 2018/0059310 | A1* | 3/2018 | Bae ........................ G02B 6/005 |
| 2018/0151842 | A1 | 5/2018 | Park et al. |
| 2018/0267208 | A1* | 9/2018 | Shih ................. B29D 11/00365 |
| 2018/0301665 | A1* | 10/2018 | Sakamoto ............... H01L 51/56 |
| 2019/0067643 | A1* | 2/2019 | Zhai .................... H01L 51/5256 |
| 2019/0165322 | A1* | 5/2019 | Shinya ................ H01L 51/5253 |
| 2021/0005843 | A1* | 1/2021 | Kishimoto .......... H01L 27/3246 |

FOREIGN PATENT DOCUMENTS

| JP | 2007-248484 | 9/2007 |
| JP | 2007-305508 | 11/2007 |
| JP | 2009-049135 | 3/2009 |
| KR | 10-2015-0074826 | 7/2015 |
| WO | 2018/034040 | 2/2018 |

OTHER PUBLICATIONS

Wei-Fang Su et al., "Thermal properties of high refractive index epoxy resin system", Thermochimica Acta 392-393, 2002, pp. 385-389.

* cited by examiner

*Primary Examiner* — Nduka E Ojeh
(74) *Attorney, Agent, or Firm* — Kile Park Reed & Houtteman PLLC

(57) ABSTRACT

A display device includes a substrate; a display element disposed on the substrate and including a pixel electrode, an opposite electrode, and an emission layer between the pixel electrode and the opposite electrode; and a roof layer defining an air cavity. The air cavity is disposed around the display element. A refractive index of the roof layer is greater than a refractive index of the air defined by the air cavity.

21 Claims, 22 Drawing Sheets

DISPLAY DEVICE WITH ROOF LAYER

CROSS-REFERENCE TO RELATED APPLICATION

This application claims the benefit of Korean Patent Application No. 10-2019-0051823 under 35 U.S.C. § 119, filed on May 2, 2019 in the Korean Intellectual Property Office, the entire disclosure of which is incorporated herein by reference.

BACKGROUND

1. Field

One or more embodiments relate to a display device, and more specifically, to a configuration therefor that increases an efficiency of propagated light and brightness thereof due to a lack of dispersion of the propagated light.

2. Description of the Related Art

Recently, the array of applications for which a display device may be used has become more diversified. As display devices have become thinner and more lightweight, such an array is constantly evolving as users place an ever increasing reliance on them to accomplish personal and professional tasks. Accordingly, it is important to reliably ensure their performance in producing an image to be displayed.

SUMMARY

One or more embodiments include a display that may provide a high-quality image.

Additional aspects will be set forth in part in the description which follows and, in part, will be apparent from the description, or may be learned by practice of the presented embodiments.

According to one or more embodiments, a display device includes: a substrate; a display element disposed on the substrate and including a pixel electrode, an opposite electrode, and an emission layer between the pixel electrode and the opposite electrode; and a roof layer defining an air cavity, the air cavity being disposed around the display element, wherein a refractive index of the roof layer may be greater than a refractive index of air defined by the air cavity.

The roof layer may include an inorganic insulating layer.

The roof layer may include at least one of silicon nitride, silicon oxide, or silicon oxynitride.

The roof layer may include a side portion inclined with respect to a main surface of the substrate.

An inclination angle of the side portion with respect to a plane parallel to the main surface of the substrate may be equal to or greater than about 50°.

The roof layer may include at least one hole.

The display device may further include: a thin-film encapsulation layer covering the display element and including at least one organic encapsulation layer and at least one inorganic encapsulation layer, wherein the at least one organic encapsulation layer may have a refractive index greater than that of the air defined by the air cavity.

The air cavity may be located on the thin-film encapsulation layer.

The air cavity may be located under the thin-film encapsulation layer.

The display device may further include: a pixel-defining layer covering edges of the pixel electrode and including an opening corresponding to the pixel electrode, wherein the air cavity may be located on the pixel-defining layer.

The air cavity may overlap the edges of the pixel electrode.

The edges of the pixel electrode may be located inside the air cavity.

The roof layer may include an opening having a width less than a width of the pixel electrode.

According to one or more embodiments, a display device includes: a substrate; a display element disposed on the substrate and including a pixel electrode, an opposite electrode, and an emission layer between the pixel electrode and the opposite electrode; and a roof layer defining an air cavity and including an inclined side portion, the inclined side portion being located on a propagation path of light that may be emitted from the display element, and the inclined side portion defining an interface between the roof layer and the air cavity to change the propagation path of the light from a direction that may be oblique with respect to a thickness direction of the substrate to at least a direction that may be parallel with the thickness direction of the substrate, wherein a refractive index of the roof layer is greater than that of the air cavity.

The roof layer may include at least one hole.

The air cavity may entirely surround the display element.

A difference between the refractive index of the roof layer and the refractive index of the air defined by the air cavity may be equal to or greater than about 0.7.

The roof layer may include an inorganic insulating layer, and an inclination angle of the side portion with respect to a main surface of the substrate may be equal to or greater than about 50°.

The roof layer may include an opening corresponding to the emission layer of the display element.

The display device may further include: a thin-film encapsulation layer covering the display element and including at least one organic encapsulation layer and at least one inorganic encapsulation layer, wherein a difference between a refractive index of the at least one organic encapsulation layer and a refractive index of the air defined by the air cavity may be equal to or greater than about 0.5.

These and/or other aspects will become apparent and more readily appreciated from the following description of the embodiments, when taken in conjunction with the accompanying drawings.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
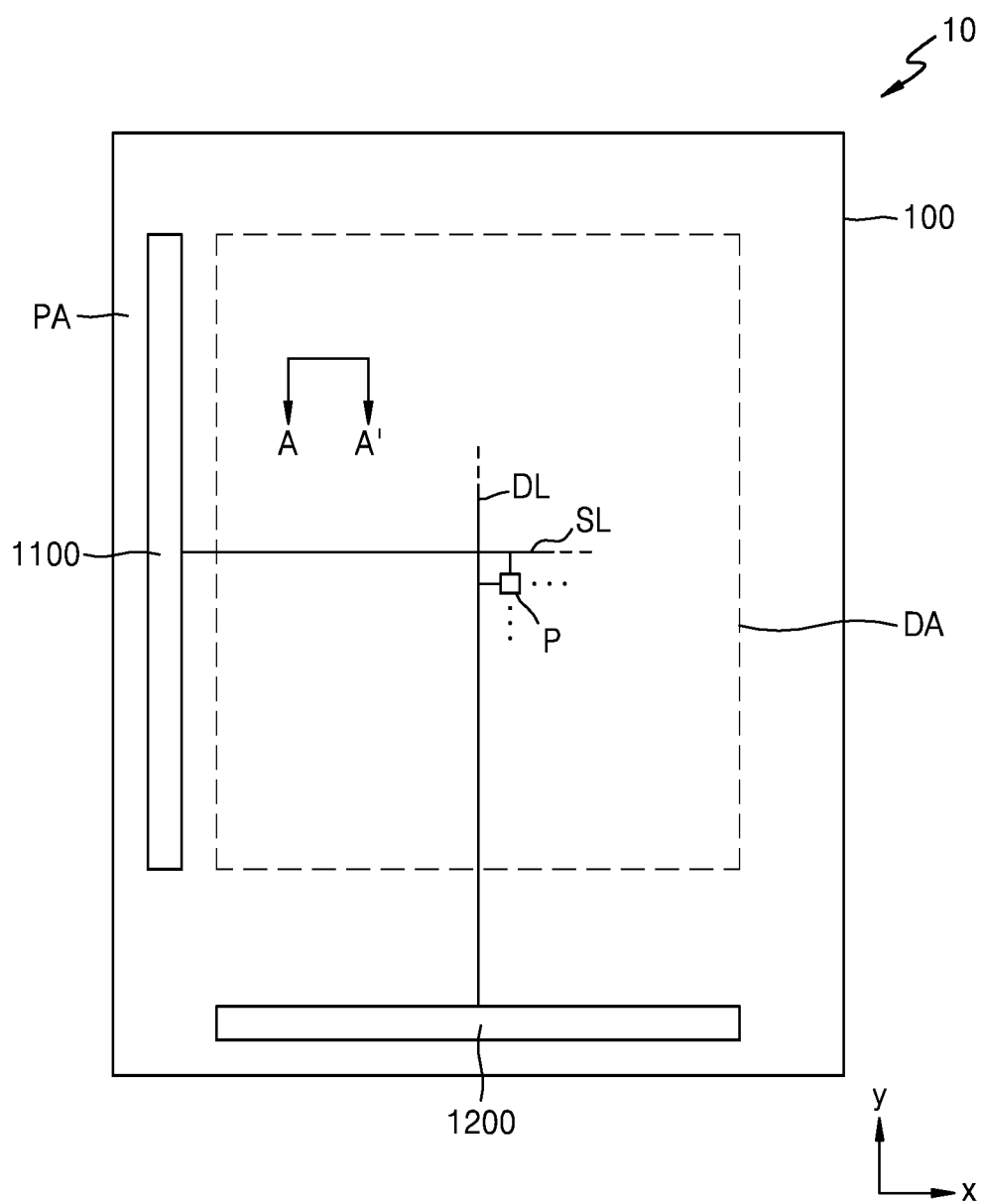
FIG. 1 shows a plan view of a display device according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

It will be understood that although the terms "first", "second", etc. may be used herein to describe various components, these components should not be limited by these terms. These components are only used to distinguish one component from another.

As used herein, the singular forms "a", "an" and "the" may include the plural forms as well, unless the context clearly indicates otherwise.

It will be further understood that the terms "comprises/includes" and/or "comprising/including" used herein specify the presence of stated features or components, but may not preclude the presence or addition of one or more other features or components.

It will be understood that when a layer, region, or component is referred to as being "formed on" another layer, region, or component, it can be directly or indirectly formed on the other layer, region, or component. That is, for example, intervening layers, regions, or components may be present.

Sizes of elements in the drawings may be exaggerated for convenience. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

It will be understood that when a layer, region, or component is referred to as being "connected" to another layer, region, or component, it may be "directly connected" to the other layer, region, or component or may be "indirectly connected" to the other layer, region, or component with other layer, region, or component interposed therebetween. For example, it will be understood that when a layer, region, or component is referred to as being "electrically connected" to another layer, region, or component, it may be "directly electrically connected" to the other layer, region, or component or may be "indirectly electrically connected" to other layer, region, or component with other layer, region, or component interposed therebetween.

Further, in the specification, the phrase "in a plan view" means when an object portion is viewed from above, and the phrase "in a cross-sectional view" means when a cross-section taken by vertically cutting an object portion is viewed from the side. Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first object may directly or indirectly oppose a second object. In a case in which a third object intervenes between the first and second object, the first and second objects may be understood as being indirectly opposed to one another, although still facing each other.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within, for example, ±30%, 20%, 10%, or 5% of the stated value.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the description.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

FIG. 1 shows a plan view of a display device 10 according to an embodiment.

The display device 10 may include a display area DA and a peripheral area PA that neighbors the display area DA. The display device 10 may include pixels P arranged in the display area DA. Each pixel P may be connected to a scan line SL and a data line DL. It may be understood that FIG. 1 shows a figure of a substrate 100 of the display device 10. For example, it may be understood that the substrate 100 includes the display area DA and the peripheral area PA.

A scan driver 1100, a data driver 1200, and a main power line (not shown) may be arranged in the peripheral area PA, the scan driver 1100 providing a scan signal to each pixel P through a scan line SL, the data driver 1200 providing a data signal to each pixel P through a data line DL, and the main power line providing a first power voltage and a second power voltage.

Though FIG. 1 shows that the data driver 1200 may be arranged on the substrate 100, the data driver 1200 may be arranged on a flexible printed circuit board (FPCB) electrically connected to a pad arranged on one side of the display device 10.

The display device 10 according to an embodiment may include an organic light-emitting display, an inorganic light-emitting display, a liquid crystal display, an electrophoretic display, a field emission display, a surface-conduction electron-emitter display, a quantum dot display, a plasma display, and a cathode ray display. Though a display device according to an embodiment may be described as an organic light-emitting display device as an example, a display device according to the disclosure may not be limited thereto.

Figure 2:
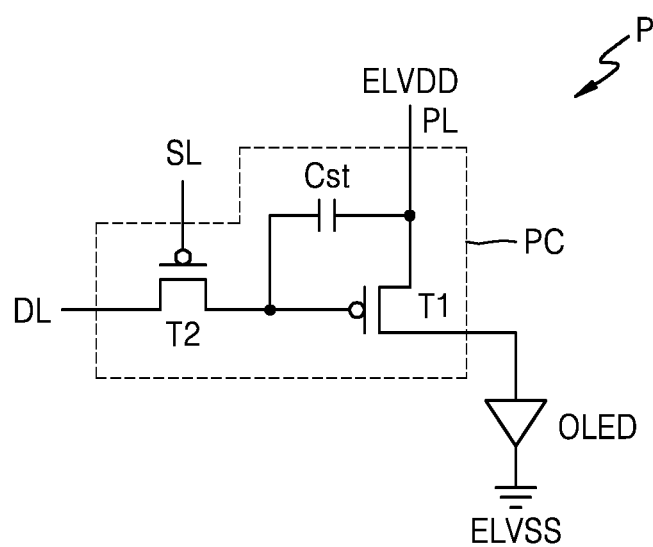
FIG. 2 shows a schematic diagram of an equivalent circuit of one of the pixels of a display device according to an embodiment.

FIG. 2 shows a schematic diagram of an equivalent circuit of one of the pixels of a display device according to an embodiment.

Referring to FIG. 2, a pixel P may include a pixel circuit PC and a display element connected to the pixel circuit PC. The display element may include, for example, an organic light-emitting diode OLED. The pixel circuit PC may include a first thin film transistor T1, a second thin film transistor T2, and a storage capacitor Cst. Each pixel P may emit, for example, red, green, or blue light or emit red, green, blue, or white light through an organic light-emitting diode OLED.

The second thin film transistor T2 may include a switching thin film transistor and may be connected to a scan line SL and a data line DL. The second thin film transistor T2 may transfer a data voltage input through the data line DL to the first thin film transistor T1 in response to a scan voltage input through the scan line SL. The storage capacitor Cst may be connected to the second thin film transistor T2 and a driving voltage line PL and may store a voltage corresponding to a difference between a voltage transferred from the second thin film transistor T2 and a first power voltage ELVDD supplied through the driving voltage line PL.

The first thin film transistor T1 may be a driving thin film transistor, be connected to the driving voltage line PL and the storage capacitor Cst, and may control a driving current flowing through an organic light-emitting diode OLED from the driving voltage line PL in response to the voltage stored in the storage capacitor Cst. The organic light-emitting diode OLED may emit light having a predetermined brightness according to the driving current. An opposite electrode (e.g. a cathode) of the organic light-emitting diode OLED may receive a second power voltage ELVSS.

Though the pixel circuit PC may include two thin film transistors and one storage capacitor, the disclosure may not be limited thereto. The number of thin film transistors and the number of storage capacitors may be variously changed depending on a design of the pixel circuit PC.

Figure 3:
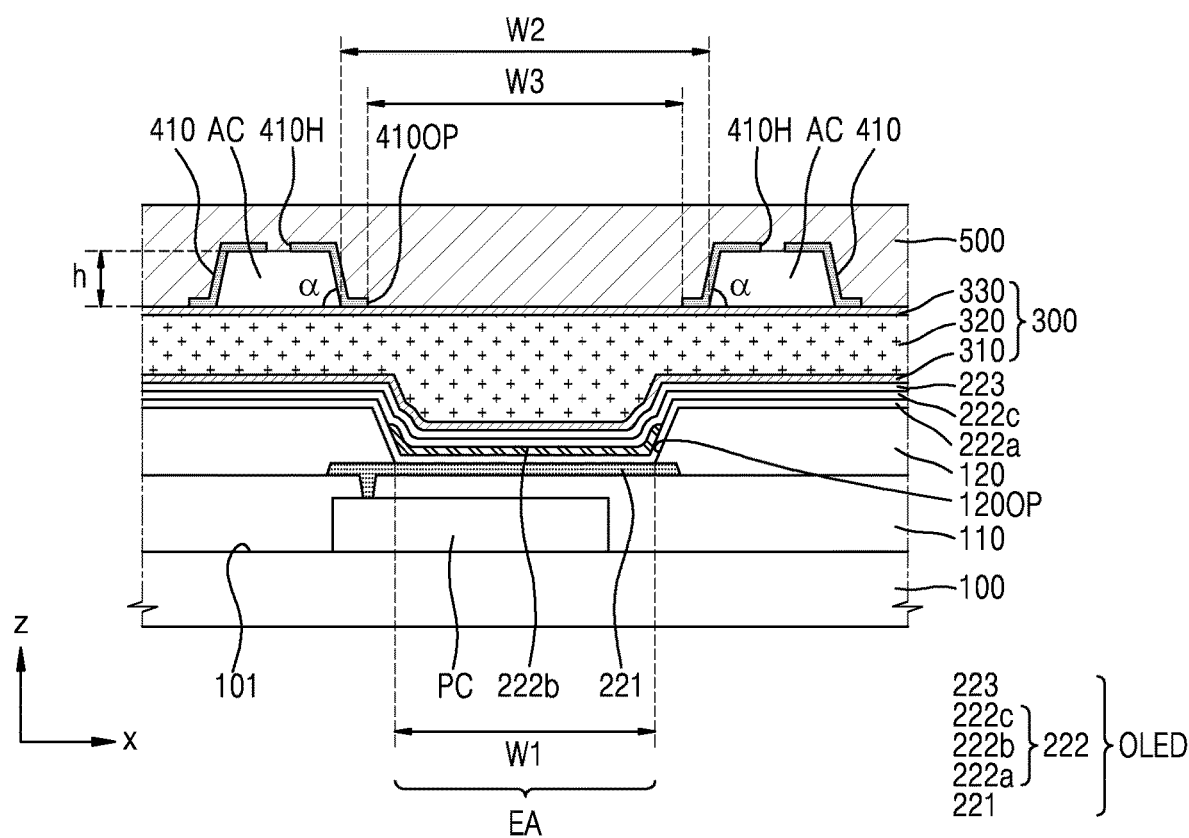
FIG. 3 shows a schematic cross-sectional view of a portion of a display device taken along line A-A' of FIG. 1 according to an embodiment.
Figure 4A:
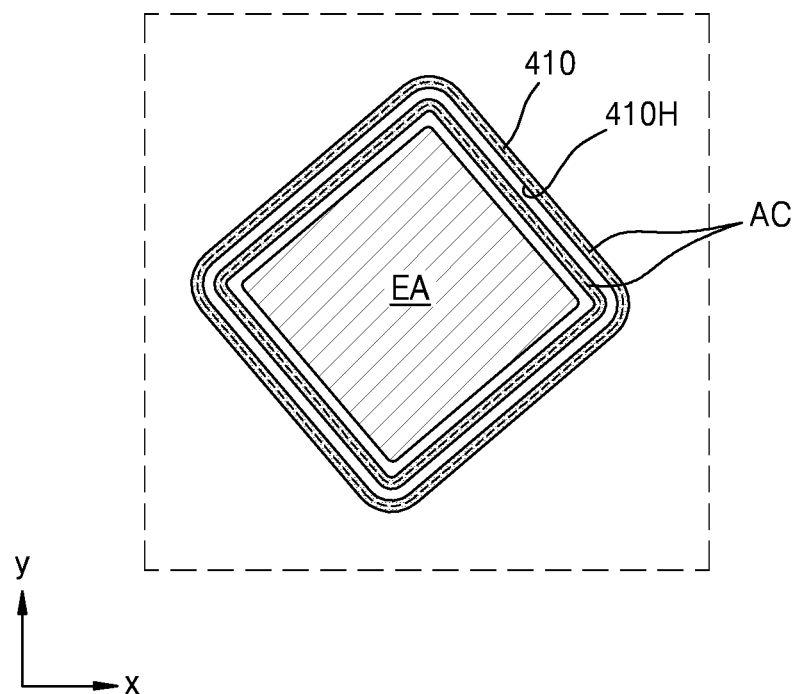
FIGS. 4A to 4C show plan views of a portion of a display device according to an embodiment, respectively.
Figure 4B:
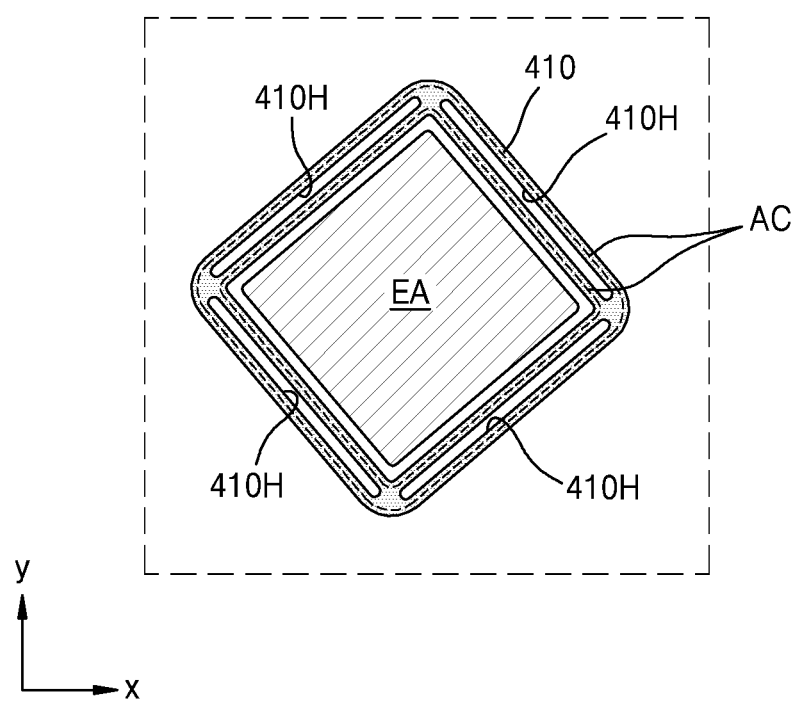
Figure 4C:
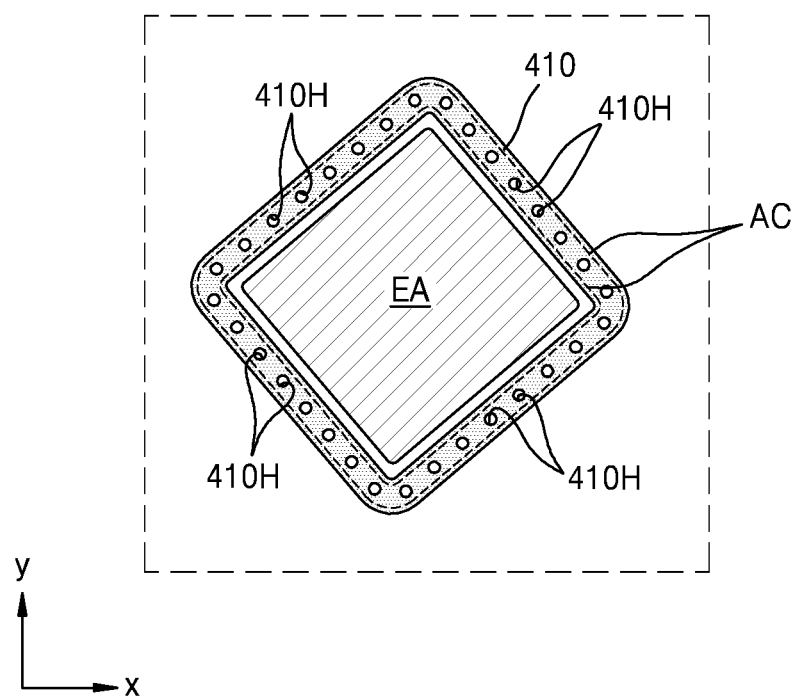

FIG. 3 shows a schematic cross-sectional view taken along line A-A' of a portion of a display device according to an embodiment, and FIGS. 4A to 4C show plan views of a portion of a display device according to an embodiment.

Referring to FIG. 3, the pixel circuit PC may be arranged on the substrate 100. The pixel circuit PC may be covered by an insulating layer 110. The organic light-emitting diode OLED may be arranged over the pixel circuit PC and electrically connected to the pixel circuit PC. A roof layer 410 may be arranged over the organic light-emitting diode OLED, and the roof layer 410 may define an air cavity AC as a light control pattern. In other words, one or more portions of the roof layer 410 forming the air cavity AC at an interface thereof with the roof layer 410 may control a pattern of light in an area adjacent to the roof layer 410 and the air cavity AC. For example, one or more portions of the roof layer 410 may serve as a light control member for forming a propagation path for light emitted from the light-emitting diode OLED, such that the emitted light may be directed from the roof layer 410 at an interface of the air cavity AC to form a controlled pattern of the emitted light.

The substrate 100 may include a glass material or a polymer resin. In an embodiment, the substrate 100 may include a glass substrate including $SiO_2$ as a main component. In another embodiment, the substrate 100 may include a base layer and a barrier layer, the base layer including a polymer resin and the barrier layer including an inorganic insulating material. For example, the substrate 100 may include a first polymer resin layer, a first inorganic barrier layer, a second polymer resin layer, and a second inorganic barrier layer that are sequentially stacked. The first and second polymer resin layers may include polyethersulfone (PES), polyarylate, polyetherimide (PEI), polyethylene naphthalate (PEN), polyethylene terephthalate (PET), polyphenylene sulfide (PPS), polyimide (PI), polycarbonate (PC), cellulose tri acetate (TAC) and/or cellulose acetate propionate (CAP), etc. The first and second inorganic barrier layers may include silicon nitride, silicon oxide, and/or silicon oxynitride.

As described with reference to FIG. 2, the pixel circuit PC may include a transistor and a storage capacitor. An insulating layer such as silicon nitride, silicon oxide, and/or silicon oxynitride may be arranged between electrodes of the transistor and/or between electrodes of the storage capacitor.

The pixel circuit PC may be covered by the insulating layer 110. A pixel electrode 221 on the insulating layer 110 may be electrically connected to the pixel circuit PC through a contact hole formed in the insulating layer 110. The insulating layer 110 may include an organic insulating layer and/or an inorganic insulating layer. The organic insulating layer may include an organic insulating material such as a general-purpose polymer such as polymethylmethacrylate (PMMA) and polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof. The inorganic insulating layer may include at least one of silicon nitride, silicon oxide, or silicon oxynitride.

The pixel electrode 221 may include a reflective layer including Ag, Mg, Al, Pt, Pd, Au, Ni, Nd, Ir, Cr, or a compound thereof. In another embodiment, the pixel electrode 221 may further include a layer on/under the reflective layer, the layer including indium tin oxide (ITO), indium zinc oxide (IZO), zinc oxide (ZnO), or indium oxide ($In_2O_3$).

A pixel-defining layer 120 may be arranged on the pixel electrode 221, the pixel-defining layer 120 and may cover edges of the pixel electrode 221. The pixel-defining layer 120 may prevent an arc, etc. from occurring between an opposite electrode 223 and the edges of the pixel electrode 221 by increasing a distance between the opposite electrode 223 and the edges of the pixel electrode 221. In other words, the pixel defining layer 120 may be disposed over the edges of the pixel electrode 221 and between the edges and the opposite electrode 223 to increase the distance and thus suppress such an arc from forming. The pixel-defining layer 120 may include an organic insulating material such as polyimide or hexamethyldisiloxane (HMDSO). The pixel-defining layer 120 may include an inorganic insulating material or include an organic insulating material and an inorganic insulating material. The pixel-defining layer 120 may include an opening 120OP overlapping or facing a central area of the pixel electrode 221. The central area of the pixel electrode 221 may be exposed through the opening 120OP of the pixel-defining layer 120.

An intermediate layer 222 may be arranged on the pixel electrode 221. The intermediate layer 222 may include an emission layer 222b. The emission layer 222b may overlap or face the opening 120OP of the pixel-defining layer 120. The emission layer 222b may include a polymer or low molecular weight organic material that may emit light of a predetermined color.

A first functional layer 222a and a second functional layer 222c may be respectively arranged under and on the emission layer 222b. The first functional layer 222a may include, for example, a hole transport layer (HTL), or include an HTL and a hole injection layer (HIL). The second functional layer 222c may be arranged on the emission layer 222b, or may be omitted. The second functional layer 222c may include an electron transport layer (ETL) and/or an electron injection layer (EIL). Like the opposite electrode 223, which will be described below, the first functional layer 222a and/or the second functional layer 222c may be common layers that entirely cover the substrate 100.

The opposite electrode 223 may include a conductive material having a small work function. For example, the opposite electrode 223 may include a (semi) transparent layer including Ag, Mg, Al, Pt, Pd, Au, Ni, Nd, Ir, Cr, Li, Ca, or an alloy thereof. Alternatively, the opposite electrode 223 may further include a layer including ITO, IZO, ZnO, or $In_2O_3$ on the (semi) transparent layer including the above material.

The organic light-emitting diode OLED may be covered by a thin-film encapsulation layer 300, which may be an encapsulation member. The organic light-emitting diode OLED may include the pixel electrode 221, the intermediate layer 222, and the opposite electrode 223. The thin-film encapsulation layer 300 may include at least one inorganic encapsulation layer and at least one organic encapsulation layer. In an embodiment, the thin-film encapsulation layer 300 may include a first inorganic encapsulation layer 310, an organic encapsulation layer 320, and a second inorganic encapsulation layer 330 that may be sequentially stacked, i.e., stacked in the stated order.

The first inorganic encapsulation layer 310 and the second inorganic encapsulation layer 330 may include at least one of inorganic materials including aluminum oxide, titanium oxide, tantalum oxide, hafnium oxide, zinc oxide, silicon oxide, silicon nitride, or silicon oxynitride.

The organic encapsulation layer 320 may include a polymer-based material. The organic encapsulation layer 320 may include a material in which a difference between a refractive index of the material and a refractive index of the air cavity AC, which will be described below, may be equal to or greater than about 0.5. For example, the organic encapsulation layer 320 may include an organic material having a refractive index ranging from about 1.5 to about 1.6. The organic encapsulation layer 320 may include an acrylic-based resin, an epoxy-based resin, polyimide, and/or polyethylene, etc. In an embodiment, the organic encapsulation layer 320 may include acrylate.

The air cavity AC may be arranged on a propagation path of light emitted from the organic light-emitting diode OLED. The propagation path of the light may include a path progressing in a direction that may be oblique to a thickness direction (i.e., a z-direction) of the display device 10. In a schematic cross-sectional view of FIG. 3, the air cavity AC may be arranged on the thin-film encapsulation layer 300 and arranged in an oblique direction between a direction (i.e., the z-direction) perpendicular to a main surface of the substrate 100 and a direction (i.e., an x-direction) parallel to the main surface of the substrate 100. In an embodiment, the air cavity AC may be arranged on the thin-film encapsulation layer 300 and may overlap or face the pixel-defining layer 120. In other words, the air cavity AC may be arranged on the thin-film encapsulation layer 300 to be oblique with respect to the z and x directions.

The air cavity AC may be defined by the roof layer 410. The roof layer 410 may include a lower portion, an upper portion, and a side portion, the lower portion contacting the thin-film encapsulation layer 300, the upper portion being apart from a top surface of the thin-film encapsulation layer 300 such that the air cavity AC may be between the thin-film encapsulation layer 300 and the upper portion, and the side portion connecting the lower portion to the upper portion. An inclination angle α of the side portion of the roof layer 410, for example, the inclination angle α of the side portion with respect to a virtual plane parallel to the main surface 101 of the substrate 100, may be equal to or greater than about 50°. For example, the inclination angle α may be equal to or greater than about 60°. One or more portions of the roof layer 410 forming the air cavity AC may be arranged on the thin-film encapsulation layer 300 to be oblique with respect to the z and x directions. For example, the one or more portions of the roof layer 410 may be arranged to be offset from the emission layer 222b. The one or more air cavity AC may be arranged to be offset from the emission area EA (or the opening 120OP of the pixel-defining layer 120). A height h of the air cavity AC may be about 1.5 μm to about 3.5 μm. For example, a height h of the air cavity AC may be about 1.5 μm to about 3.5 μm, or about 2 μm to about 3 μm.

The roof layer 410 may include an inorganic material. In an embodiment, the roof layer 410 may include an inorganic insulating layer. The roof layer 410 may include silicon oxide, silicon nitride, and/or silicon oxynitride.

The roof layer 410 may have a refractive index greater than a refractive index n (about 1.0) of the air cavity AC, i.e., a refractive index n of air within the air cavity AC. As an example, a difference between a refractive index of the air cavity AC and a refractive index of the roof layer 410 may be equal to or greater than about 0.5. As another example, a difference between a refractive index of the air cavity AC and a refractive index of the roof layer 410 may be equal to or greater than about 0.6. As another example, a difference between a refractive index of the air cavity AC and a refractive index of the roof layer 410 may be equal to or greater than about 0.7. In an embodiment, in a case where the roof layer 410 may include silicon nitride, a difference between a refractive index of the air cavity AC and a refractive index of the roof layer 410 may be adjusted by adjusting an amount of silicon of the roof layer 410. A refractive index of the roof layer 410 may be from about 1.7 to about 1.9.

Referring to FIGS. 3 and 4A to 4C, the air cavity AC may be entirely around a periphery of an emission area EA so as to surround (e.g., entirely surround) the emission area EA in a plan view. An inner width (for example a width W2 between portions of the air cavity AC arranged on two opposite sides of the emission area EA with the emission area EA therebetween) may be equal to or greater than a width W1 of the emission area EA. The width W1 of the emission area EA may be defined as a width of the opening 120OP of the pixel-defining layer 120.

The roof layer 410 may include a hole 410H overlapping or facing the air cavity AC. The hole 410H of the roof layer 410 may be formed during a process of forming the air cavity AC. One hole 410H may be provided in the roof layer 410, or a multiple holes 410H may be provided in the roof layer 410. In an embodiment, as shown in FIG. 4A, one hole 410H may be provided to be entirely around the periphery of the emission area EA so as to surround the emission area EA. As shown in FIG. 4B, holes 410H may each have a slit shape and may be arranged along a side of the emission area EA. As shown in FIG. 4C, holes 410H may be arranged to be entirely around a periphery of the emission area EA so as to surround the emission area EA, and may be spaced apart from each other.

The roof layer 410 may include an opening 410OP overlapping or facing the emission area EA and/or the opening 120OP of the pixel-defining layer 120. Like the hole 410H, the opening 410OP of the roof layer 410 forms through hole that passes through a top surface and a bottom surface of the roof layer 410. A width W3 of the opening 410OP of the roof layer 410 may be equal to or greater than the width W1 of the opening 120OP of the pixel-defining layer 120.

The roof layer 410 may be covered by a planarization layer 500. The planarization layer 500 may include an organic insulating material. The planarization layer 500 may be formed by coating and hardening an organic material having viscosity. As described above, though the roof layer 410 may include at least one hole 410H. An organic material that may be the same as that of the planarization layer 500 may be prevented from being on an inside of the air cavity AC by adjusting the viscosity of the organic material constituting the planarization layer 500.

Figure 5:
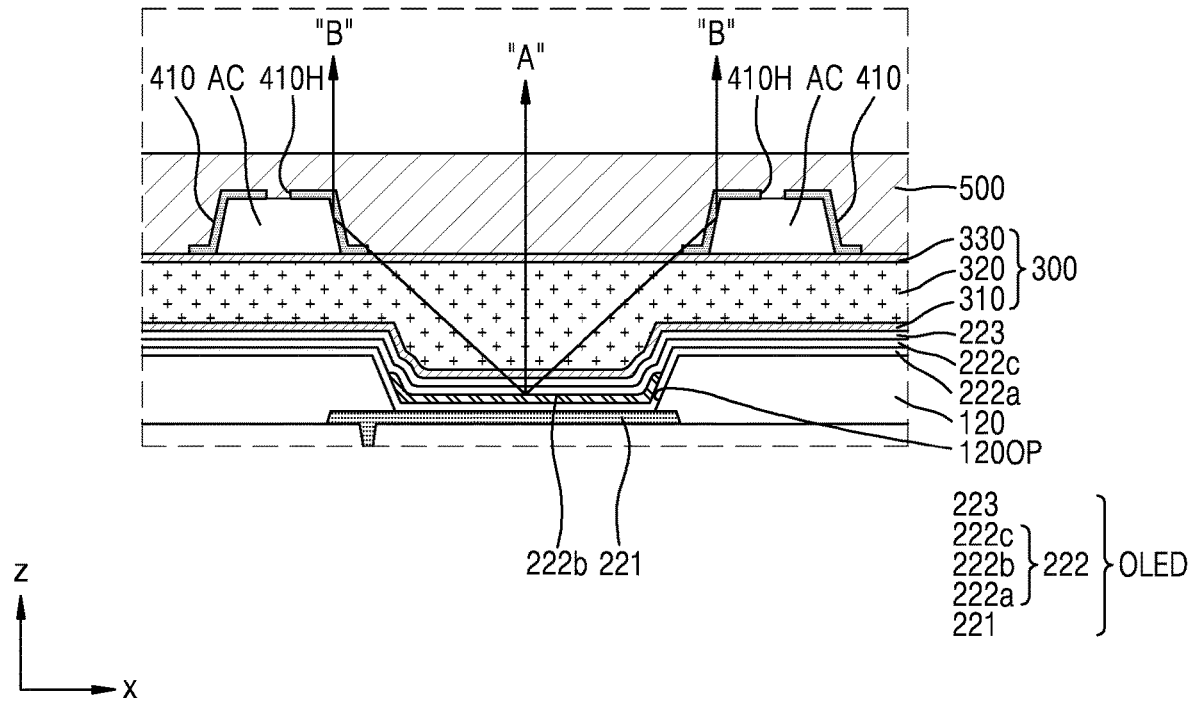
FIG. 5 shows a schematic cross-sectional view of a path of light emitted from a display element of a display device taken along line A-A' of FIG. 1 according to an embodiment.

FIG. 5 shows a schematic cross-sectional view of a path of light emitted from a display element of a display device according to an embodiment.

Referring to FIG. 5, light emitted from the organic light-emitting diode OLED and propagating in the thickness direction (i.e., the z-direction) may progress in the thickness direction. That is, the light may progress along a path "A" without a path change. Further, and when considering examples that are different from the embodiments herein, light emitted from the organic light-emitting diode OLED and progressing in an oblique direction (e.g. an oblique direction between the z-direction and the x-direction) immediately and continually progresses in the oblique direction in the case where there may be no roof layer 410 defining the air cavity AC. As a result, the brightness of the light emitted from the organic light-emitting diode OLED may be reduced. However, according to an embodiment, as described with reference to FIGS. 3 and 5, for example, since the roof layer 410 defining the air cavity AC may also be arranged obliquely on the above-described oblique propagation path of light, total reflection of the light may occur on an interface between the air cavity AC and the roof layer 410. In other words, the propagation path of the light may be changed from a case in which the light travels completely obliquely with respect to the z and x directions, i.e., when there may be no roof layer 410, to progress along a path "B" since the air cavity AC and one or more portions of the roof layer 410 forming the air cavity AC are offset from the emission area EA. As an example, the path "B" may define a path defining portions thereof that are at least parallel to the z direction, i.e., the thickness direction of the display device 10. Therefore, a light-emission efficiency of the organic light-emitting diode OLED may improve and brightness of the light emitted from the organic light-emitting diode OLED may increase. In other words, a greater amount of light may be emitted and reflected with increased brightness when the light may be emitted, collectively, along the paths "A" and "B," when compared with examples that are different from the embodiments herein.

Figure 6A:
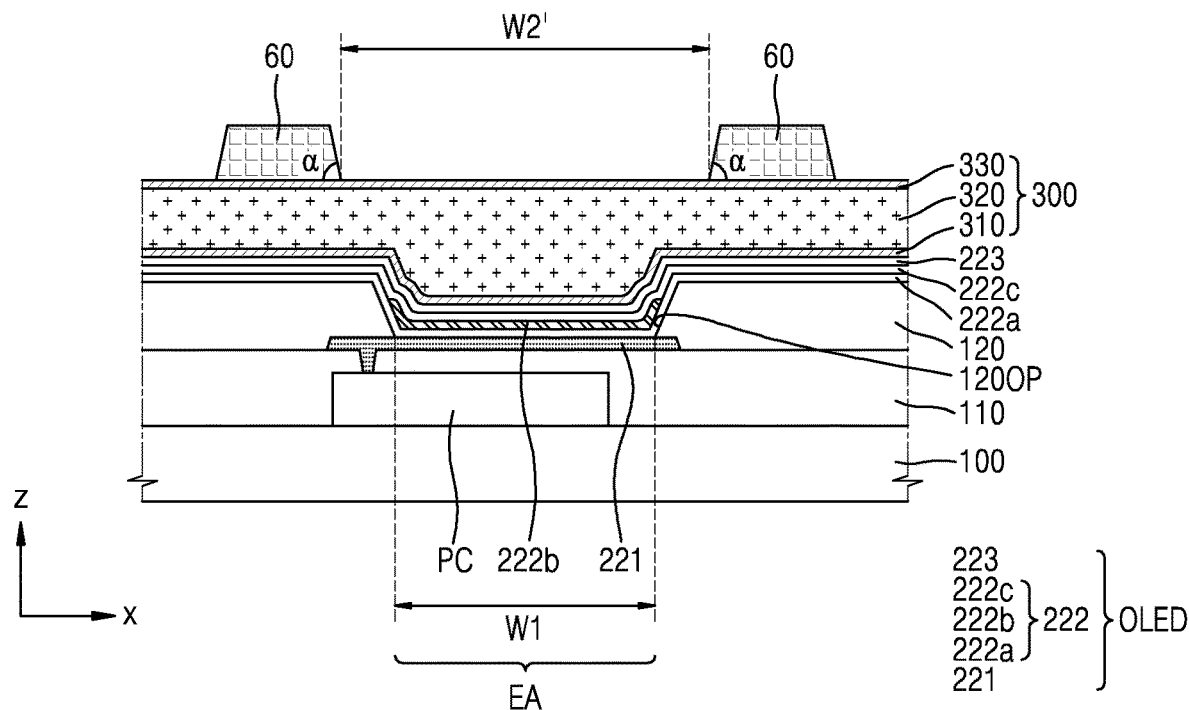
FIGS. 6A to 6F show schematic cross-sectional views taken along line A-A' of FIG. 1 of a process of manufacturing a display device according to an embodiment.
Figure 6B:
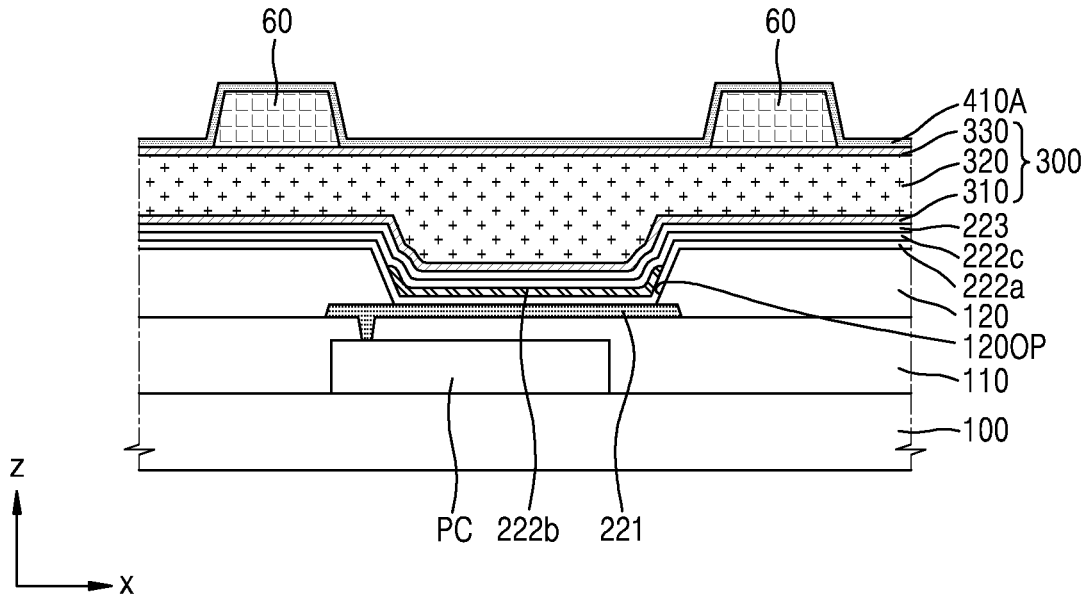
Figure 6C:
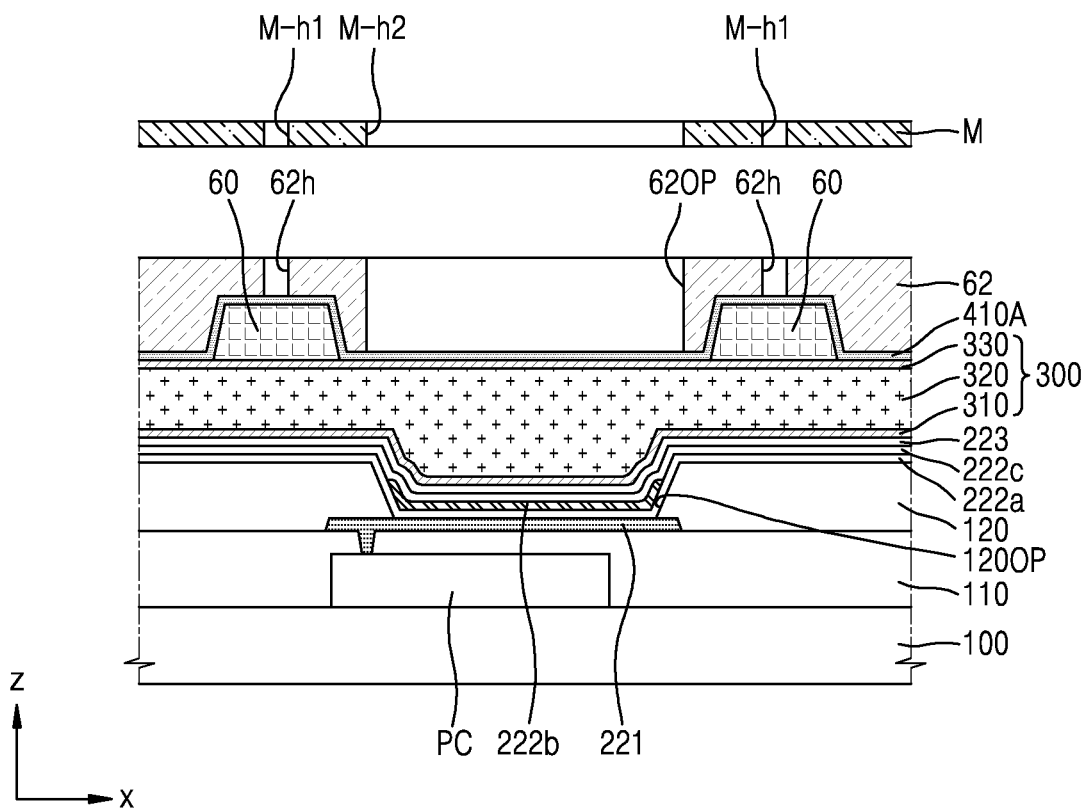
Figure 6D:
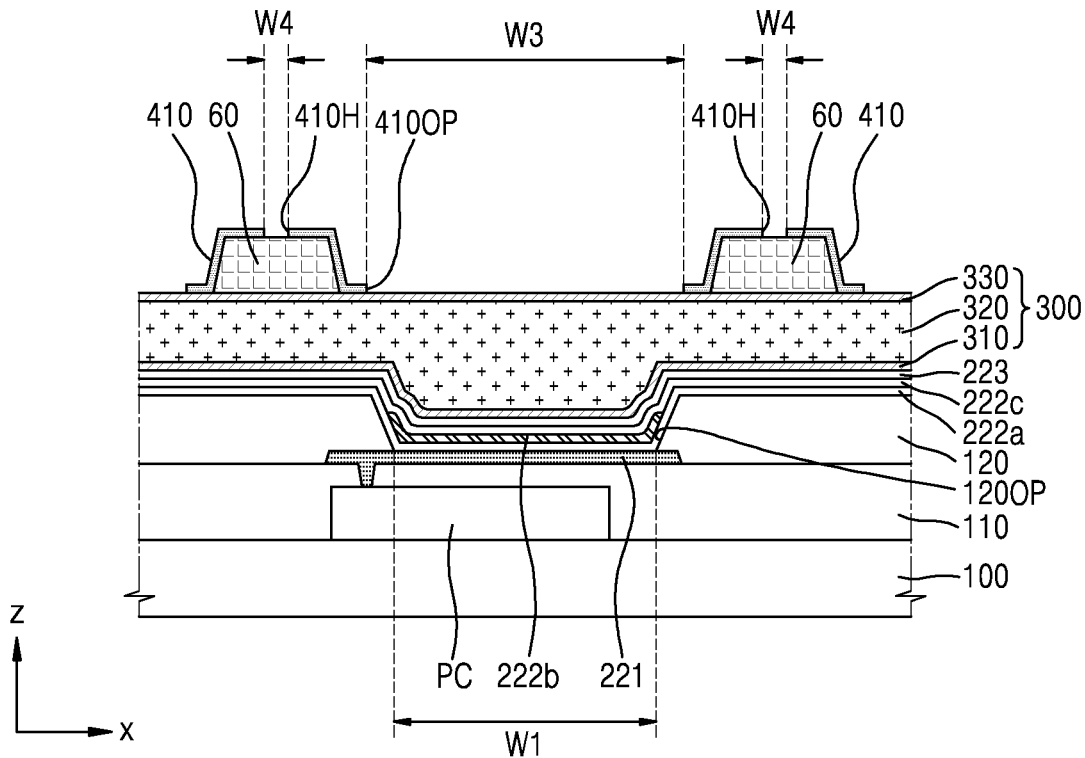
Figure 6E:
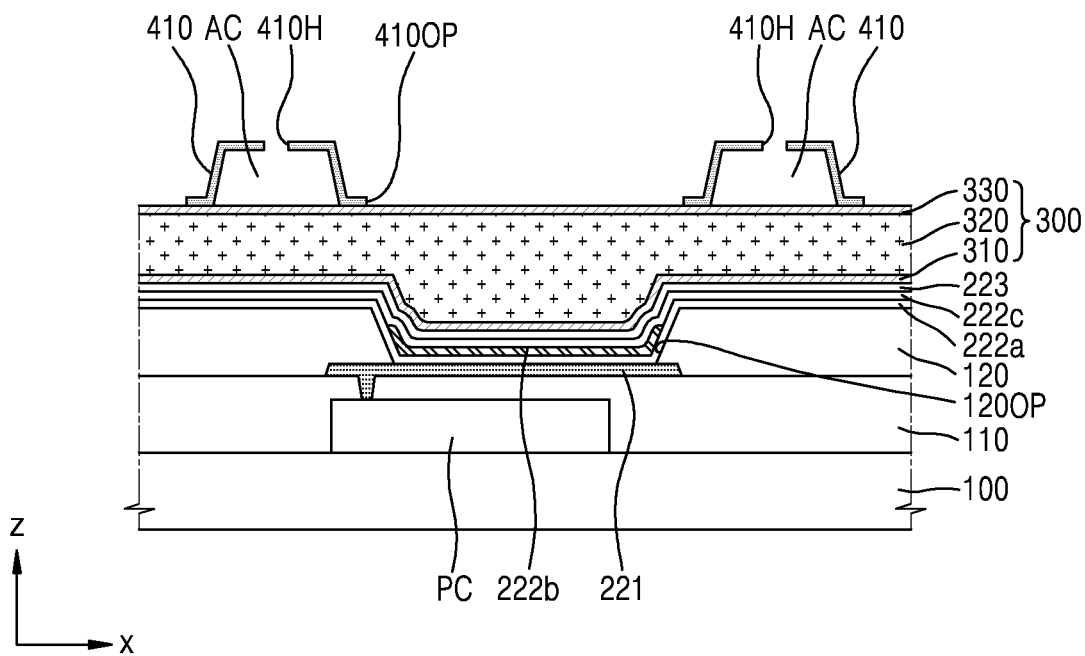
Figure 6F:
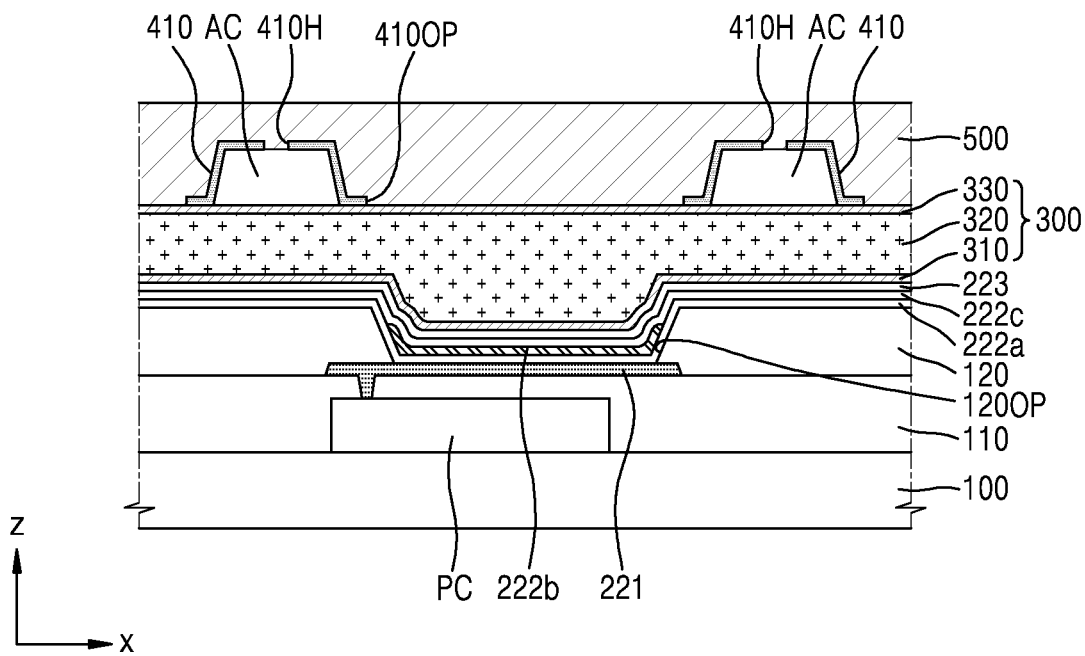
Figure 6G:
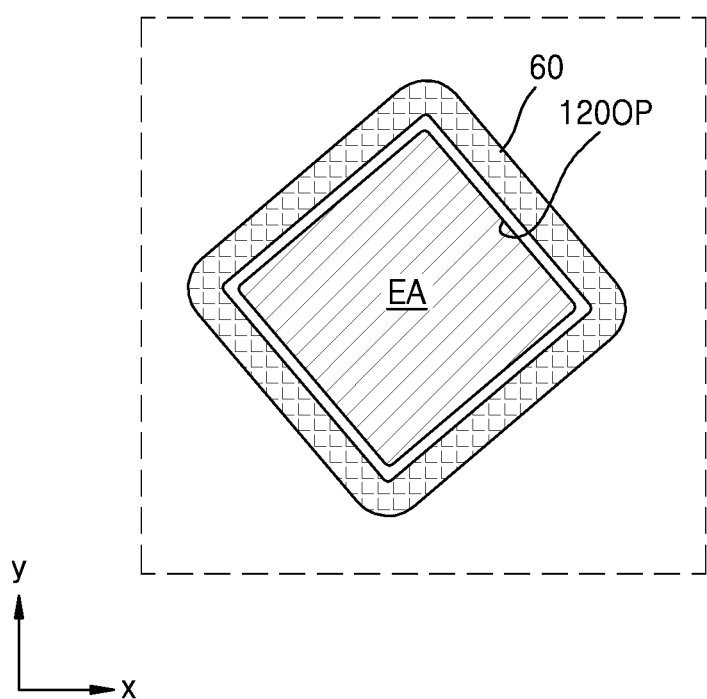
FIG. 6G shows a plan view of FIG. 6A.

FIGS. 6A to 6F show schematic cross-sectional views taken along line A-A' of FIG. 1 for explaining a process of manufacturing a display device according to an embodiment, and FIG. 6G shows a plan view of FIG. 6A.

Referring to FIG. 6A, the pixel circuit PC may be formed on the substrate 100, and the insulating layer 110 covering the pixel circuit PC may be formed. The pixel electrode 221 may be formed to be electrically connected to the pixel circuit PC through a contact hole of the insulating layer 110. The pixel electrode 221 may be formed by a process that may include forming a material layer constituting the pixel electrode 221 and etching the material layer. As shown in FIG. 6A, the pixel electrode 221 may be formed in an island shape to correspond to each pixel.

The pixel-defining layer 120 including the opening 120OP may be formed, and the intermediate layer 222 and the opposite electrode 223 may be sequentially formed. The emission layer 222b of the intermediate layer 222 may be located to correspond to each pixel such that the emission layer 222b may overlap or face the pixel electrode 221. The first functional layer 222a and the second functional layer 222c of the intermediate layer 222, and the opposite electrode 223 may each be formed as one body so as to cover multiple pixels.

The thin-film encapsulation layer 300 may be formed on the opposite electrode 223. The first inorganic encapsulation layer 310 and the second inorganic encapsulation layer 330 of the thin-film encapsulation layer 300 may be formed by chemical vapor deposition (CVD). The organic encapsulation layer 320 may be formed by coating and hardening a monomer, or formed by coating a polymer. Materials of the organic light-emitting diodes OLED and the thin-film encapsulation layer 300 may be the same as those described above.

An organic structure 60 may be formed by disposing a photosensitive organic material on the thin-film encapsulation layer 300 and patterning the photosensitive organic material. The organic structure 60 may include a photosensitive organic material that may react to light in a specific wavelength band (e.g., ultraviolet (UV), etc.). As shown in FIG. 6G, the organic structure 60 may be entirely around a periphery of the emission area EA so as to surround the emission area EA of the organic light-emitting diode OLED. In other words, the organic structure 60 may be entirely around a periphery of the opening 120OP of the pixel-defining layer 120. An inner width W2' between portions of the organic structure 60, with the emission area EA as the opening 120OP of the pixel-defining layer 120 therebetween, may be equal to or greater than the width W1 of the opening 120OP of the pixel-defining layer 120.

The organic structure 60 may have an inclined lateral surface. A cross-section of the organic structure 60 may have an approximate trapezoidal shape. An inclination angle α of the lateral surface of the organic structure 60 may be equal to or greater than about 50°. For example, the inclination angle α may be equal to or greater than about 60°.

Referring to FIG. 6B, an inorganic insulating layer 410A may be formed on the organic structure 60. The inorganic insulating layer 410A may be entirely formed over the substrate 100. The inorganic insulating layer 410A may directly contact a top surface and a lateral surface of the organic structure 60, and a top surface of a layer (e.g. the thin-film encapsulation layer 300) arranged under the organic structure 60.

The inorganic insulating layer 410A may be formed by CVD. The inorganic insulating layer 410A may include silicon nitride. The inorganic insulating layer 410A may include silicon oxide and/or silicon oxynitride. In an embodiment, a refractive index of the inorganic insulating layer 410A including silicon nitride may be adjusted by adjusting an amount of silicon thereof. For example, a refractive index of the inorganic insulating layer 410A may be from about 1.7 to about 1.9.

Referring to FIGS. 6C and 6D, the roof layer 410 may be formed by patterning the inorganic insulating layer 410A. As shown in FIG. 6C, a photosensitive organic layer 62 may be formed on the inorganic insulating layer 410A. The photosensitive organic layer 62 may be patterned by using a mask M including a first transmissive portion M-h1 and a second transmissive portion M-h2. The photosensitive organic layer 62 may include a hole 62h and an opening 62OP, wherein the hole 62h and the opening 62OP may be formed while portions of the photosensitive organic layer 62 that respectively correspond to the first transmissive portion M-h1 and the second transmissive portion M-h2 are removed.

As shown in FIG. 6D, the roof layer 410 including the hole 410H and the opening 410OP may be formed by etching the inorganic insulating layer 410A using the photosensitive organic layer 62. The opening 410OP and the hole 410H may correspond to through holes passing through a top surface and a bottom surface of the roof layer 410.

The width W3 of the opening 410OP of the roof layer 410 may be equal to or greater than the width W1 of the opening 120OP of the pixel-defining layer 120. A width W4 of the hole 410H may be about 1 μm to about 3 μm.

Referring to FIG. 6E, the organic structure 60 may be removed through the hole 410H of the roof layer 410. In an embodiment, the organic structure 60 may be removed through a developing process and the air cavity AC may be formed in a space resulting from a removal of the organic structure 60 via the hole 410H of the roof layer 410.

As shown in FIG. 6F, the planarization layer 500 may be formed. The planarization layer 500 may include an organic insulating material. In an embodiment, the planarization layer 500 may be formed by coating an organic material having viscosity and then hardening the organic material. Though the hole 410H may be formed in the roof layer 410, organic material that includes the same material as that of the planarization layer 500 may not be disposed inside the air cavity AC or there may be a small amount of the organic material inside the air cavity AC as a result of adjusting the viscosity of the organic material constituting the planarization layer 500.

Figure 7:
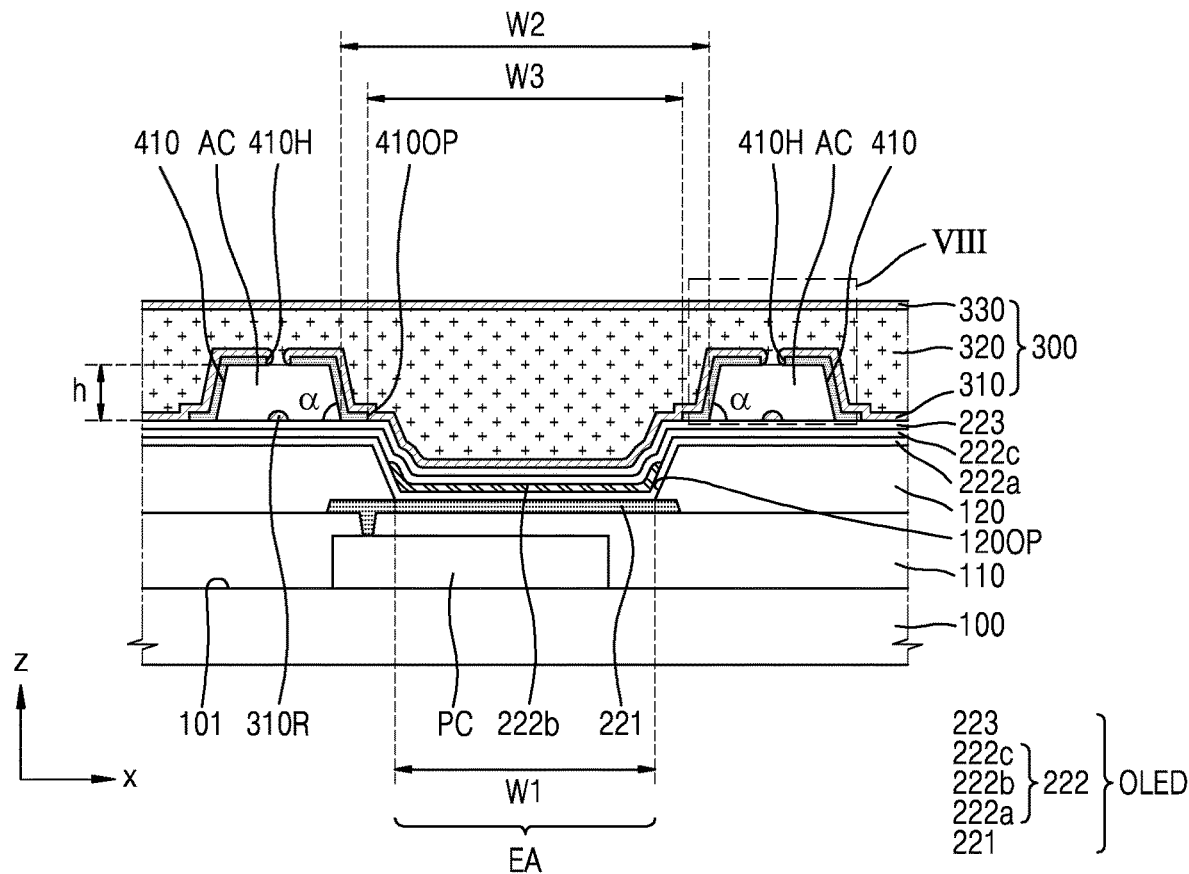
FIG. 7 shows a schematic cross-sectional view taken along line A-A' of FIG. 1 of a portion of a display device according to an embodiment.
Figure 8:
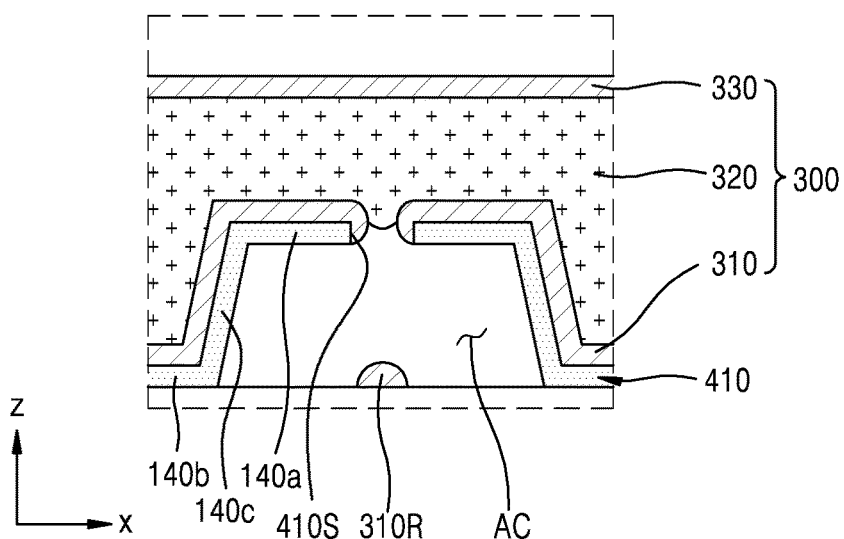
FIG. 8 shows an enlarged view of a region VIII of FIG. 7.

FIG. 7 shows a schematic cross-sectional view of a portion of a display device according to an embodiment, and FIG. 8 shows an enlarged view of a region VIII of FIG. 7.

Referring to FIG. 7, the pixel circuit PC may be located on the substrate 100, and the pixel electrode 221 of the organic light-emitting diode OLED may be arranged on the insulating layer 110 covering the pixel circuit PC. The organic light-emitting diode OLED may include the pixel electrode 221, the intermediate layer 222, and the opposite electrode 223, and edges of the pixel electrode 221 may be covered by the pixel-defining layer 120.

The air cavity AC may be between the pixel-defining layer 120 and the thin-film encapsulation layer 300. For example, the air cavity AC may be located on the opposite electrode 223. The roof layer 410 defining the air cavity AC may include an upper portion (140a, FIG. 8), a lower portion (140b, FIG. 8), and a side portion (140c, FIG. 8), the upper portion (140a) being apart from a top surface of the opposite electrode 223 such that the air cavity AC may be between the upper portion (140a) of the roof layer 410 and the opposite electrode 223. The lower portion (140b) may be located under the upper portion (140a), and the side portion (140c) may connect the upper portion (140a) to the lower portion (140b). The lower portion (140b) may contact the top surface of the opposite electrode 223.

The lower portion of the roof layer 410 may extend in a direction that may be away from the air cavity AC and may contact a top surface of the opposite electrode 223. In the case where a capping layer may be arranged on the opposite electrode 223, the lower portion of the roof layer 410 may contact a top surface of the capping layer. The capping layer may include LiF, an inorganic insulating material, and/or an organic insulating material.

The side portion of the roof layer 410 may be inclined with respect to a virtual plane parallel to the main surface 101 of the substrate 100. An inclination angle α of the side portion may be equal to or greater than about 50°. For example, the inclination angle α may be equal to or greater than about 60°. A height h of the air cavity AC defined by the roof layer 410 may be about 1.5 μm to about 3.5 μm, or about 2 μm to about 3 μm.

The roof layer 410 may include an inorganic insulating layer including an inorganic material, for example, silicon nitride, silicon oxide, and/or silicon oxynitride. The roof layer 410 may have a refractive index greater than a refractive index n (about 1.0) of the air cavity AC. A difference between a refractive index of the air cavity AC and a refractive index of the roof layer 410 may be equal to or greater than about 0.7. For example, the refractive index of the roof layer 410 may be about 1.7 to about 1.9. Since light emitted from the organic light-emitting diode OLED propagates obliquely with respect to the z and x directions, such light may be totally reflected on and by an interface, e.g., a side portion (140c. FIG. 8) of the roof layer 410, between the air cavity AC and the roof layer 410. As a result, a light-emission efficiency of the organic light-emitting diode OLED may improve and brightness of the light that may be emitted may improve.

The thin-film encapsulation layer 300 may be located on the roof layer 410. The thin-film encapsulation layer 300 may include at least one inorganic encapsulation layer and at least one organic encapsulation layer. As shown in FIG. 7, the thin-film encapsulation layer 300 may include the first inorganic encapsulation layer 310, the organic encapsulation layer 320, and the second inorganic encapsulation layer 330 in an embodiment.

The first inorganic encapsulation layer 310 may be formed on the roof layer 410. The first inorganic encapsulation layer 310 may contact the roof layer 410. As shown in FIG. 8, the first inorganic encapsulation layer 310 may be located on a top surface of the roof layer 410 and lateral surfaces 410S of the roof layer 410 that define the hole 410H. Since the roof layer 410 may include the hole 410H formed in an upper portion thereof, there may be a small amount of an inorganic material 310R inside the air cavity AC, the inorganic material 310R including the same material as that of the first inorganic encapsulation layer 310.

The organic encapsulation layer 320 may include a material in which a difference between a refractive index of the material and a refractive index of the air cavity AC may be equal to or greater than about 0.5. For example, the material may be an organic material having a refractive index ranging from about 1.5 to about 1.6. In the case where a difference between a refractive index of the organic encapsulation layer 320 and a refractive index of the air cavity AC meets the above-described range, a propagation path of light emitted from the organic light-emitting diode OLED may be changed. For example, the brightness of the display device may be effectively increased by more effectively changing a path of light that may be emitted from the organic light-emitting diode OLED, and which continually progresses in an oblique direction with respect to the above-described z and x directions to a path that may be at least parallel with the z or thickness direction of the display device 10.

Though FIG. 7 shows that the air cavities AC defined by the roof layer 410 may be arranged on two opposite sides of the emission area EA, the air cavity AC may be arranged to be entirely around a periphery of the emission area EA so as to surround the emission area EA in a plan view as described with reference to FIGS. 4A to 4C. One hole 410H of the roof layer 410 may be provided to entirely surround the emission area EA as described with reference to FIG. 4A. Multiple holes 410H each having a slit shape may be arranged along the edge of the emission area EA as shown in FIG. 4B. Multiple holes 410H may be arranged to be entirely around a periphery of the emission area EA so as to surround the emission area EA as shown in FIG. 4C, and may be spaced apart from each other. The hole 410H of the roof layer 410 may have a width ranging from about 1 µm to about 3 µm.

The roof layer 410 may include the opening 410OP corresponding to the emission area EA. The width W3 of the opening 410OP of the roof layer 410 may be equal to or greater than the width W1 of the opening 120OP of the pixel-defining layer 120 and may be less than the width W2 between portions of the air cavity AC that are located on two opposite sides of the opening 120OP with the opening 120OP of the pixel-defining layer 120 therebetween.

Figure 9:
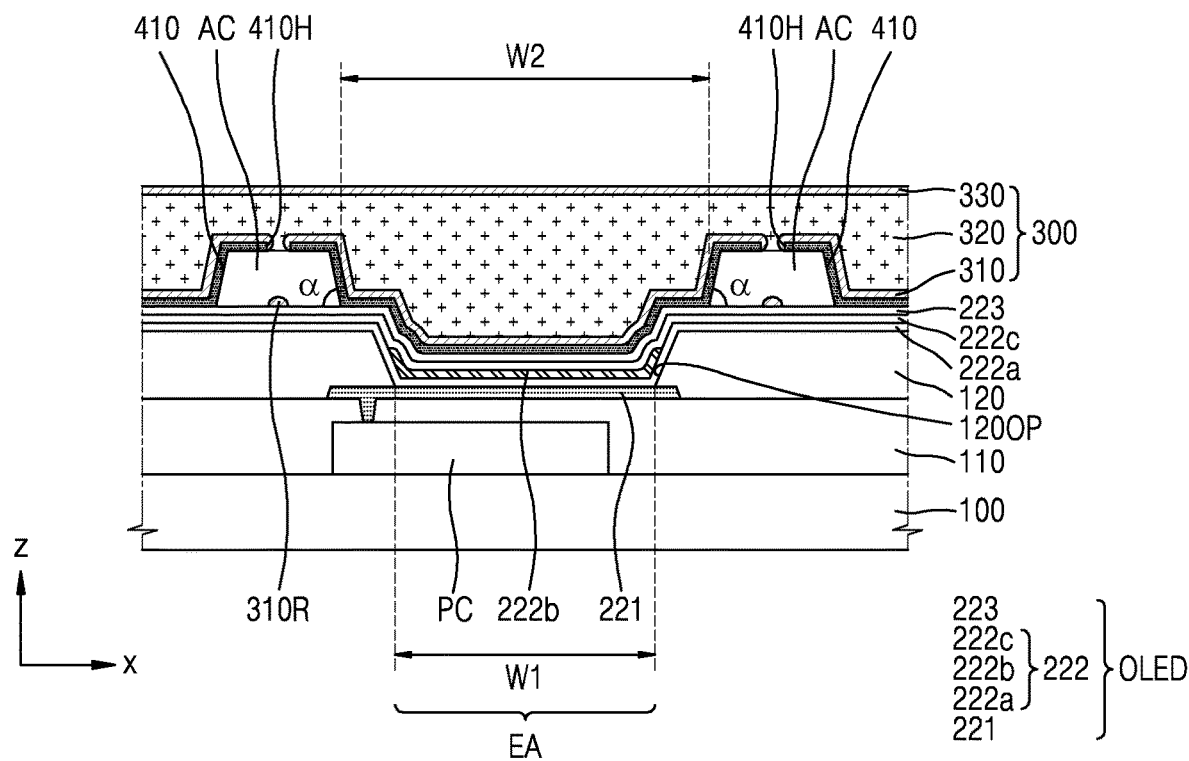
FIG. 9 shows a schematic cross-sectional view taken along line A-A' of FIG. 1 of a portion of a display device according to an embodiment.
Figure 10A:
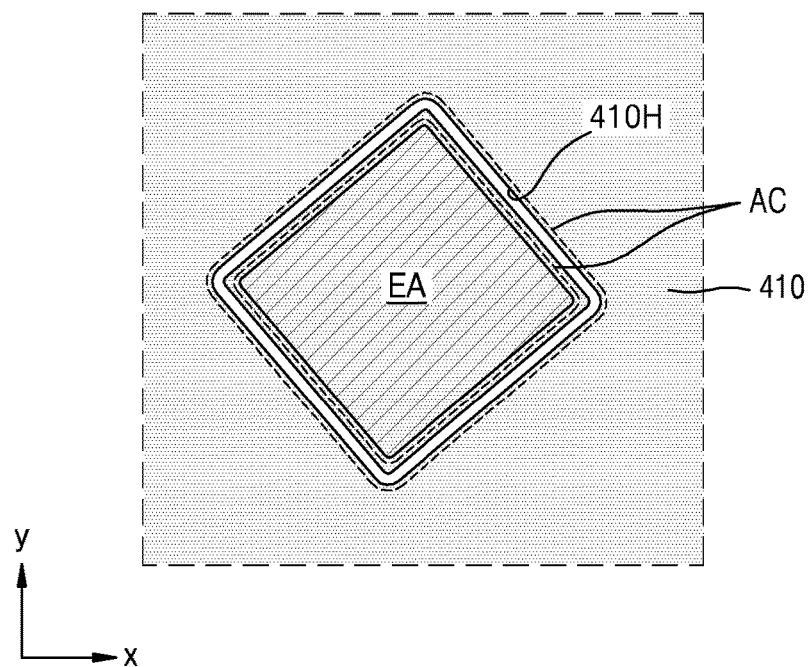
FIGS. 10A to 10C show plan views of a portion of a display device according to an embodiment, respectively.
Figure 10B:
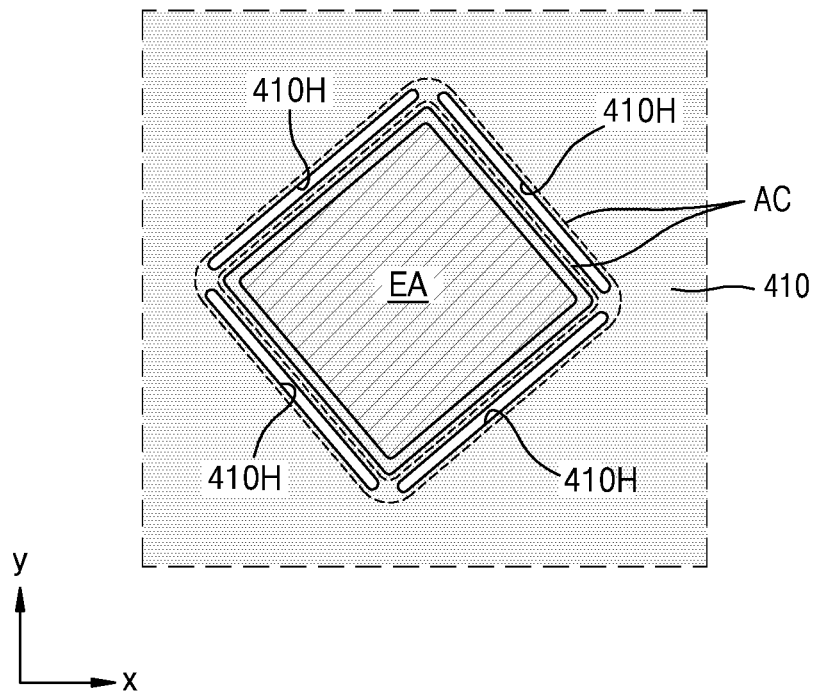
Figure 10C:
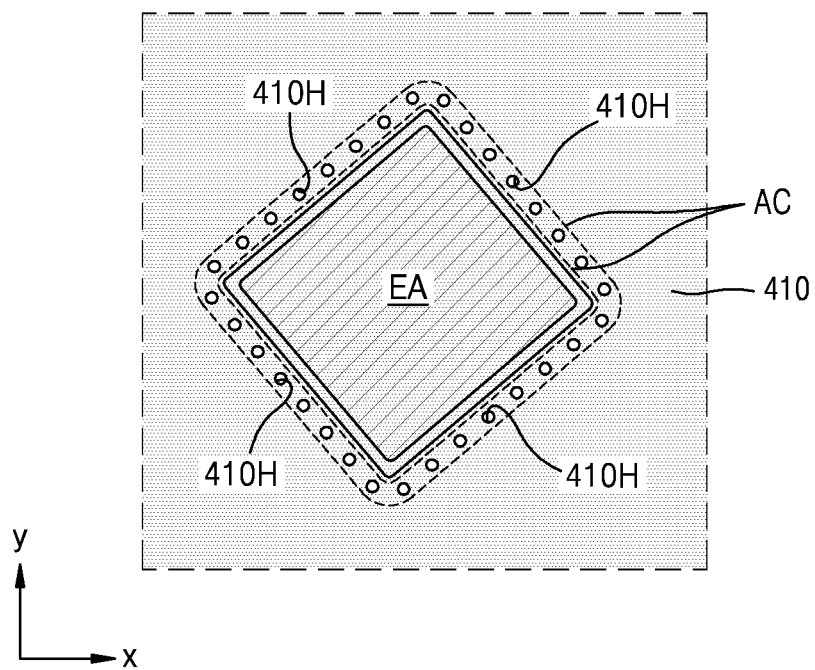

FIG. 9 shows a schematic cross-sectional view of a portion of a display device according to an embodiment, and FIGS. 10A to 10C show plan views of a portion of a display device according to an embodiment.

Though the roof layer 410 described with reference to FIG. 7 may include the opening 410OP overlapping or facing the opening 120OP of the pixel-defining layer 120, the roof layer 410 may not include the opening 410OP, wherein, as may be shown in FIG. 9, the opening 410OP may be absent.

Referring to FIGS. 9 and 10A to 10C, the roof layer 410 may include the hole 410H corresponding to the air cavity AC and may be continuously formed so as to entirely cover the emission area EA. The roof layer 410 may include silicon nitride, silicon oxide, and/or silicon oxynitride. In other words, similar to the first inorganic encapsulation layer 310, the roof layer 410 may simultaneously serve as an inorganic encapsulation layer.

In a case where the roof layer 410 may formed to entirely cover the rest of the regions excluding at least one hole 410H, for example, the display area DA (see FIG. 1) including the emission area EA, the roof layer 410 may serve as a second inorganic encapsulation layer similar to the first inorganic encapsulation layer 310. In an embodiment, the first inorganic encapsulation layer 310 shown in FIG. 9 may be omitted.

The roof layer 410 may include one hole 410H around a periphery of so as to surround the emission area EA as shown in FIG. 10A, include the holes 410H each having a slit shape and extending along a side of the emission area EA as shown in FIG. 10B, or include the holes 410H that may be apart from each other along the edge of the emission area EA as shown in FIG. 10C.

Figure 11:
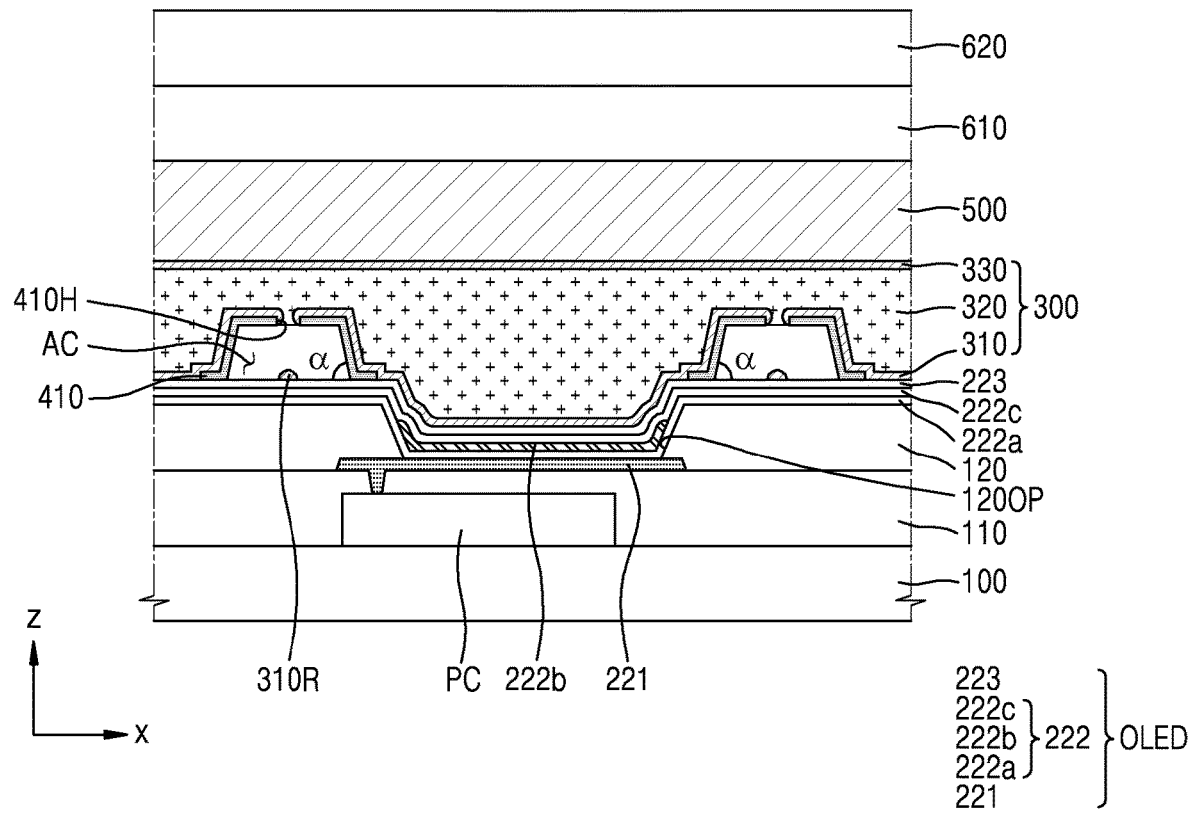
FIG. 11 shows a schematic cross-sectional view taken along line A-A' of FIG. 1 of a portion of a display device according to an embodiment.

FIG. 11 shows a schematic cross-sectional view of a portion of a display device according to an embodiment.

Referring to FIG. 11, the display device may further include the planarization layer 500 arranged on the thin-film encapsulation layer 300. The thin-film encapsulation layer 300 may be arranged over the air cavity AC. Since the thin-film encapsulation layer 300 may include the organic encapsulation layer 320, the organic encapsulation layer 320 may improve a flatness of the display device 10 while entirely covering elements thereunder. The planarization layer 500 may be further arranged on the thin-film encapsulation layer 300 and may thus further improve the flatness of the display device 10. The planarization layer 500 may prevent a member located on the planarization layer 500, for example, a touch input layer 610 and/or an optical functional layer 620, from being separated or detached from the display device 10.

The touch input layer 610 may include touch electrodes arranged in an x-direction and a y-direction. The touch input layer 610 may sense an external input by using a mutual cap method and/or a self cap method. Though FIG. 11 shows that the touch input layer 610 may be arranged on the planarization layer 500, the touch input layer 610 may be arranged between the thin-film encapsulation layer 300 and the planarization layer 500 in an embodiment.

The optical functional layer 620 may include a reflection prevention layer. The reflection prevention layer may include a retarder and a polarizer. In another embodiment, the reflection prevention layer may include a color filter layer. In another embodiment, the reflection prevention layer may include a destructive interference structure. The destructive interference structure may include a first reflective layer and a second reflective layer arranged on different layers. First-reflected light and second-reflected light respectively reflected by the first reflective layer and the second reflective layer may destructively interfere with each other and thus external light reflectivity may be reduced.

The touch input layer 610 and/or the optical functional layer 620 described with reference to FIG. 11 may be equally applicable to the embodiment(s) described with reference to FIGS. 3 and 9 and embodiments derived therefrom.

FIGS. 12A to 12E show schematic cross-sectional views of a portion of a display device according to another embodiment.

Figure 12A:
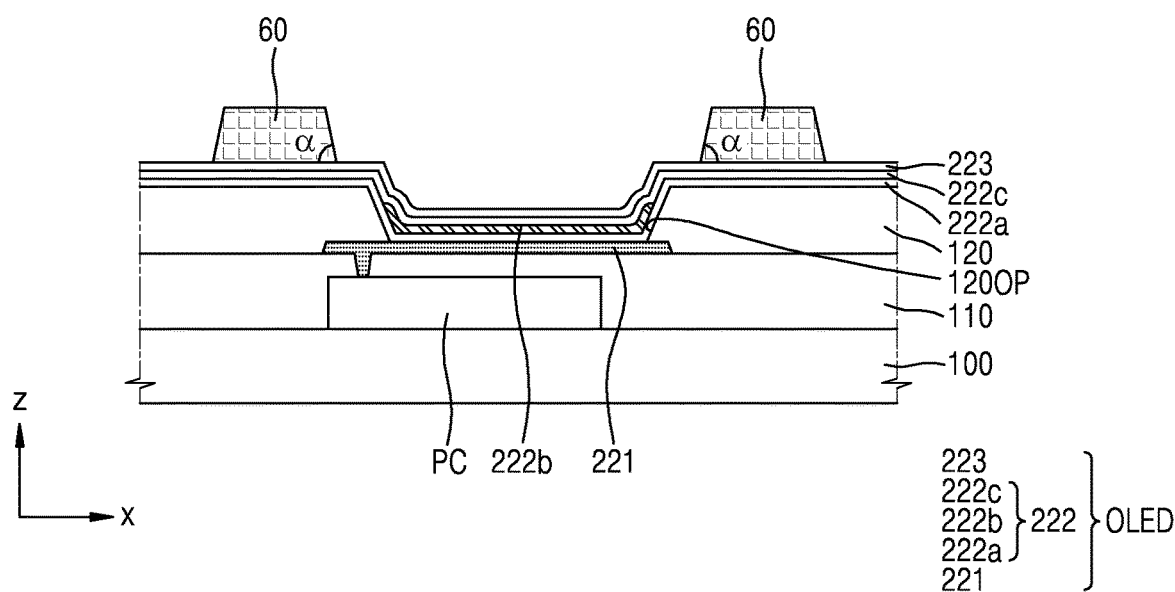
FIGS. 12A to 12E show cross-sectional views taken along line A-A' of FIG. 1 of a portion of a display device according to an embodiment, respectively.

Referring to FIG. 12A, the pixel circuit PC may be formed on the substrate 100, and the insulating layer 110 covering the pixel circuit PC may be formed thereon. The pixel electrode 221 may be formed to be electrically connected to the pixel circuit PC through a contact hole of the insulating layer 110.

The pixel-defining layer 120 may be formed to include the opening 120OP, and the intermediate layer 222 and the opposite electrode 223 may be formed. A capping layer may be further formed on the opposite electrode 223 to include LiF, an inorganic insulating material, or an organic insulating material. Hereinafter, for convenience of description, the capping layer may be omitted.

As described above, the organic light-emitting diode OLED including the pixel electrode 221, the intermediate layer 222, and the opposite electrode 223 may be formed and the organic structure 60 may be formed. The organic structure 60 may be formed by disposing a photosensitive organic material layer over the substrate 100 and then patterning the photosensitive organic material layer. The organic structure 60 may include a photosensitive organic material. The organic structure 60 may be formed to be entirely around a periphery of the emission area EA so as to surround the emission area EA of the organic light-emitting diode OLED, which may be, for example, the opening 120OP of the pixel-defining layer 120 as described with reference to FIG. 6G.

The organic structure 60 may have an inclined lateral surface. A cross-section of the organic structure 60 may have an approximate trapezoidal shape. An inclination angle α of the lateral surface of the organic structure 60 may be equal to or greater than about 50°. For example, the inclination angle α may be equal to or greater than about 60°.

Figure 12B:
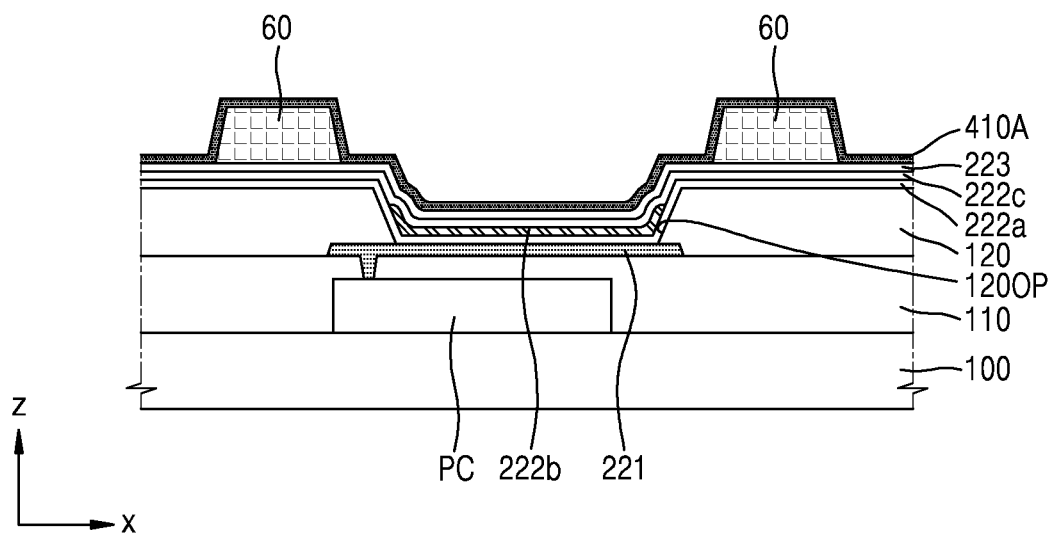

Referring to FIG. 12B, the inorganic insulating layer 410A may be formed on the organic structure 60. The inorganic insulating layer 410A may be formed by CVD. The inorganic insulating layer 410A may include silicon nitride, silicon oxide, and/or silicon oxynitride. In an embodiment, a refractive index of the inorganic insulating layer 410A including silicon nitride may be adjusted by adjusting an amount of silicon thereof. For example, the refractive index of the inorganic insulating layer 410A may be about 1.7 to about 1.9.

Figure 12C:
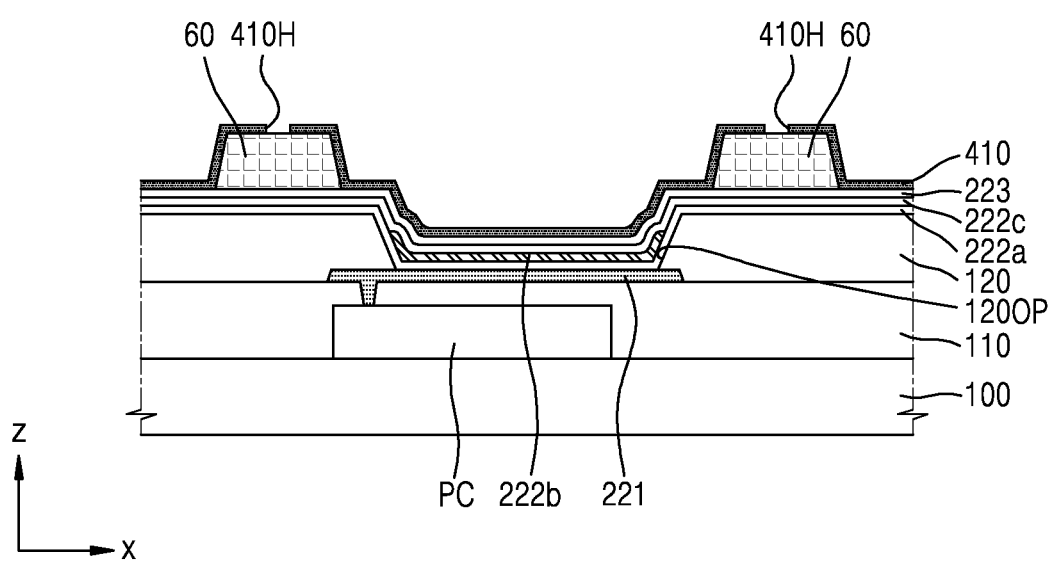

As shown in FIG. 12C, the roof layer 410 may formed by patterning the inorganic insulating layer 410A to include the hole 410H. Similar to the description made with reference to FIG. 6C, a process of patterning the inorganic insulating layer 410A may be performed by using a mask and a photosensitive organic layer. The roof layer 410 may be continuously formed to cover a region corresponding to the opening 120OP of the pixel-defining layer 120. Though FIG. 12C shows that the roof layer 410 may cover the opening 120OP of the pixel-defining layer 120, the roof layer 410 may include the opening 410OP corresponding to the emission area EA as described with reference to FIG. 6D.

Figure 12D:
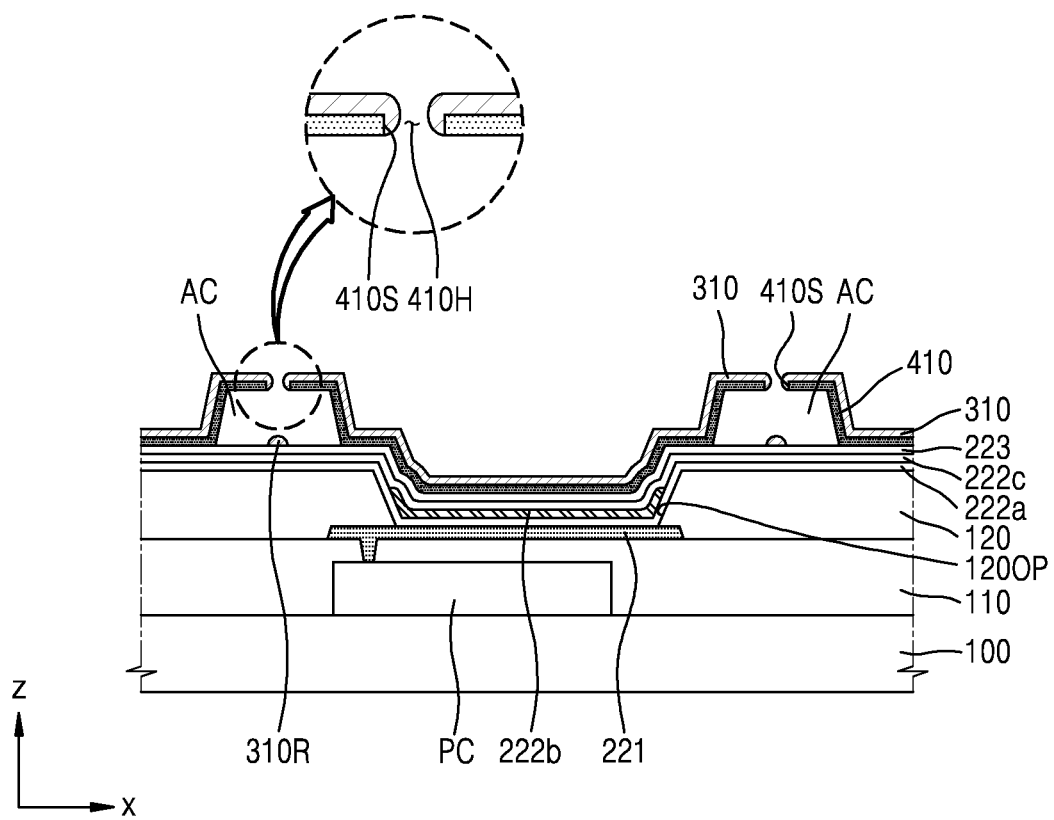

Referring to FIG. 12D, the air cavity AC may be formed by removing the organic structure 60 through the hole 410H of the roof layer 410.

The first inorganic encapsulation layer 310 may be formed on the roof layer 410 in which the hole 410H may be formed. The first inorganic encapsulation layer 310 may be formed by CVD. A small amount of the inorganic material 310R may be disposed inside the air cavity AC during a process of forming the first inorganic encapsulation layer 310, the inorganic material 310R including the same material as that of the first inorganic encapsulation layer 310. As shown in an enlarged view of FIG. 12D, the first inorganic encapsulation layer 310 may be located on a top surface of the roof layer 410 and lateral surfaces 410S of the roof layer 410 that define the hole 410H.

Figure 12E:
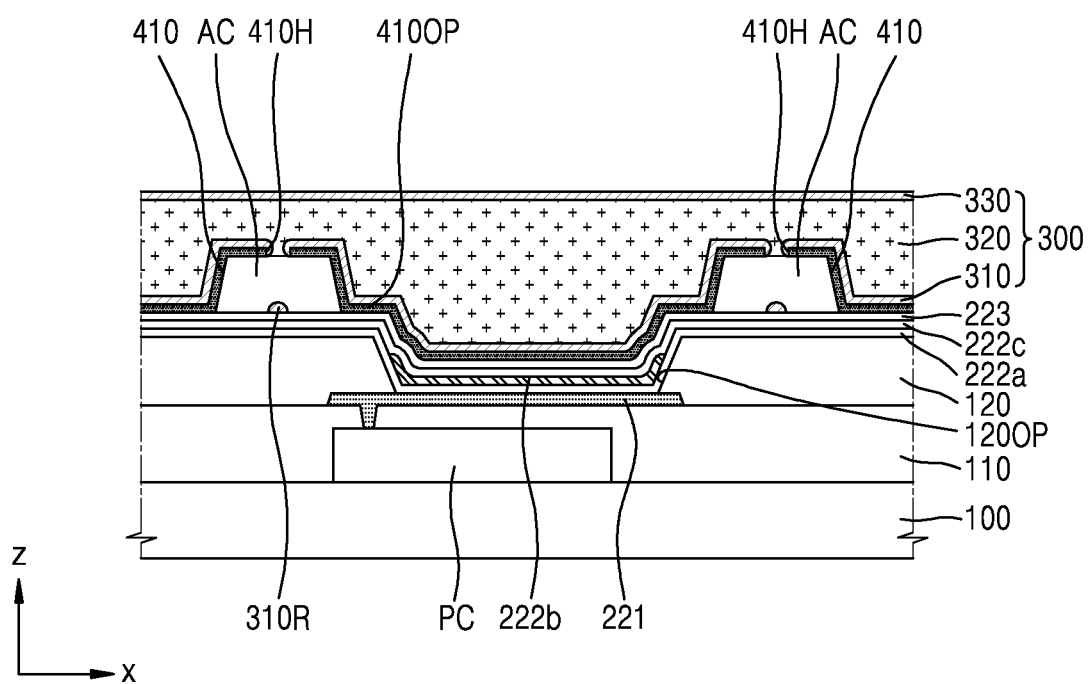

Referring to FIG. 12E, the organic encapsulation layer 320 and the second inorganic encapsulation layer 330 may be sequentially formed on the first inorganic encapsulation layer 310. The organic encapsulation layer 320 may be formed by coating and hardening a monomer, or formed by coating a polymer.

Figure 13:
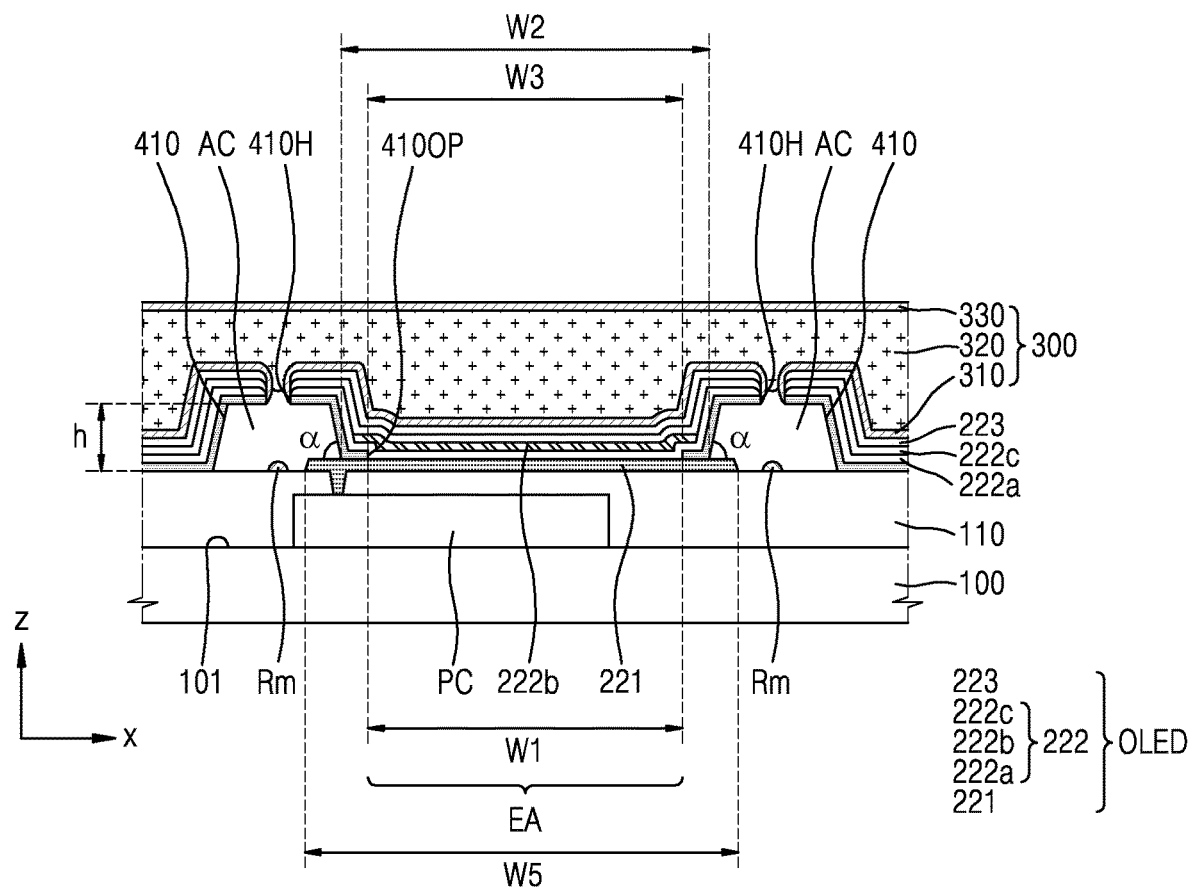
FIG. 13 shows a schematic cross-sectional view taken along line A-A' of FIG. 1 of a portion of a display device according to an embodiment.
Figure 14:
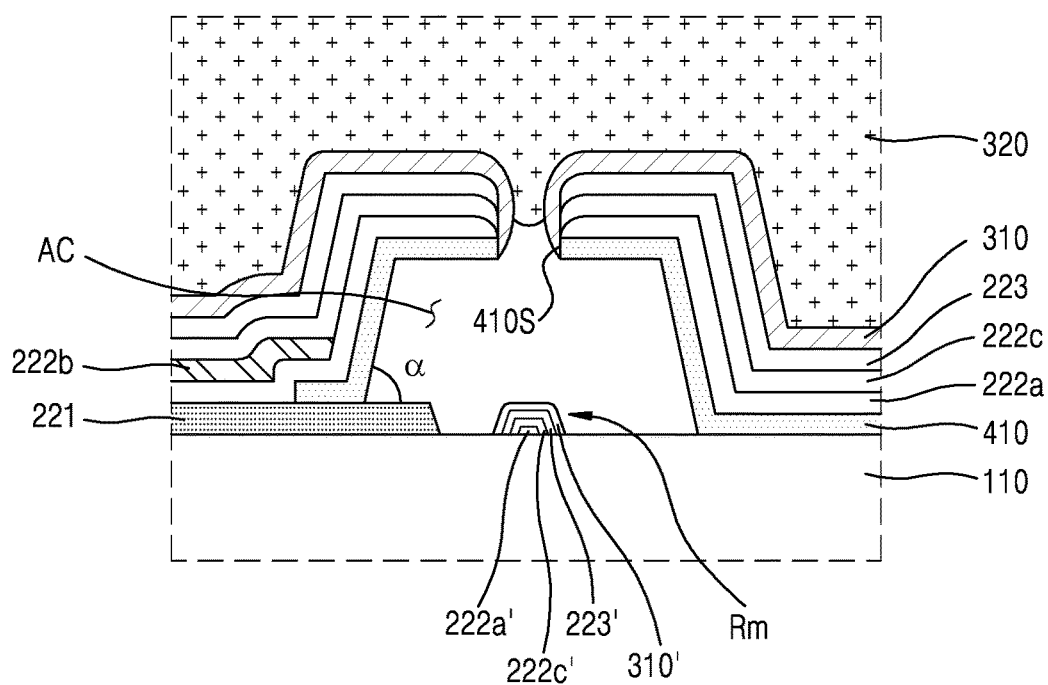
FIG. 14 shows an enlarged cross-sectional view taken along line A-A' of FIG. 1 of an air cavity and surroundings thereof of a display device according to an embodiment.

FIG. 13 shows a schematic cross-sectional view of a portion of a display device according to another embodiment, and FIG. 14 shows an enlarged cross-sectional view of an air cavity AC and surroundings thereof of a display device according to such embodiment.

Referring to FIG. 13, the pixel circuit PC may be arranged on the substrate 100, and the pixel electrode 221 of the organic light-emitting diode OLED may be arranged on the insulating layer 110 covering the pixel circuit PC.

The air cavity AC may be arranged in a propagation direction of light emitted from the organic light-emitting diode OLED. In an embodiment, the air cavity AC may be between the insulating layer 110 and the thin-film encapsulation layer 300. For example, the air cavity AC may be located on the pixel electrode 221. The roof layer 410 defining the air cavity AC may include an upper portion, a lower portion, and a side portion, the upper portion being apart from a top surface of the insulating layer 110 such that the air cavity AC may be between the upper portion of the roof layer 410 and the insulating layer 110. The lower portion may be located under the upper portion, and the side portion may connect the upper portion to the lower portion. One side of the lower portion of the roof layer 410 may contact a top surface of the pixel electrode 221, and another side of the lower portion of the roof layer 410 may contact a top surface of the insulating layer 110.

The roof layer 410 may include the opening 410OP overlapping or facing the pixel electrode 221, and the width W3 of the opening 410OP may be less than a width W5 of the pixel electrode 221. The opening 410OP of the roof layer 410 may correspond to the emission area so as to define the emission area EA. The air cavity AC may be defined by the roof layer 410 and cover an edge of the pixel electrode 221. The roof layer 410 defining the air cavity AC may not only define the emission area EA but may also prevent an arc, etc. from occurring between the opposite electrode 223 and the edges of the pixel electrode 221 by increasing a distance between the opposite electrode 223 and the edges of the pixel electrode 221, as similarly described hereinabove.

The side portion of the roof layer 410 may be inclined with respect to a virtual plane parallel to the main surface 101 of the substrate 100. An inclination angle α of the side portion may be equal to or greater than about 50°. For example, the inclination angle α may be equal to or greater than about 60°. A height h of the air cavity AC defined by the roof layer 410 may be about 1.5 μm to about 3.5 μm, or about 2 μm to about 3 μm.

The roof layer 410 may have a refractive index greater than a refractive index n (about 1.0) of the air cavity AC. A difference between a refractive index of the air cavity AC and a refractive index of the roof layer 410 may be equal to or greater than about 0.5. A difference between a refractive index of the air cavity AC and a refractive index of the roof layer 410 may be equal to or greater than about 0.6. A difference between a refractive index of the air cavity AC and a refractive index of the roof layer 410 may be equal to or greater than about 0.7.

The roof layer 410 may include an inorganic material. For example, the roof layer 410 may include an inorganic insulating layer such as silicon nitride, silicon oxide, and/or silicon oxynitride. In an embodiment, in a case where the roof layer 410 includes silicon nitride, a difference between a refractive index of the air cavity AC and a refractive index of the roof layer 410 may be adjusted by adjusting an amount of silicon thereof. A refractive index of the roof layer 410 may be from about 1.7 to about 1.9.

Figure 15A:
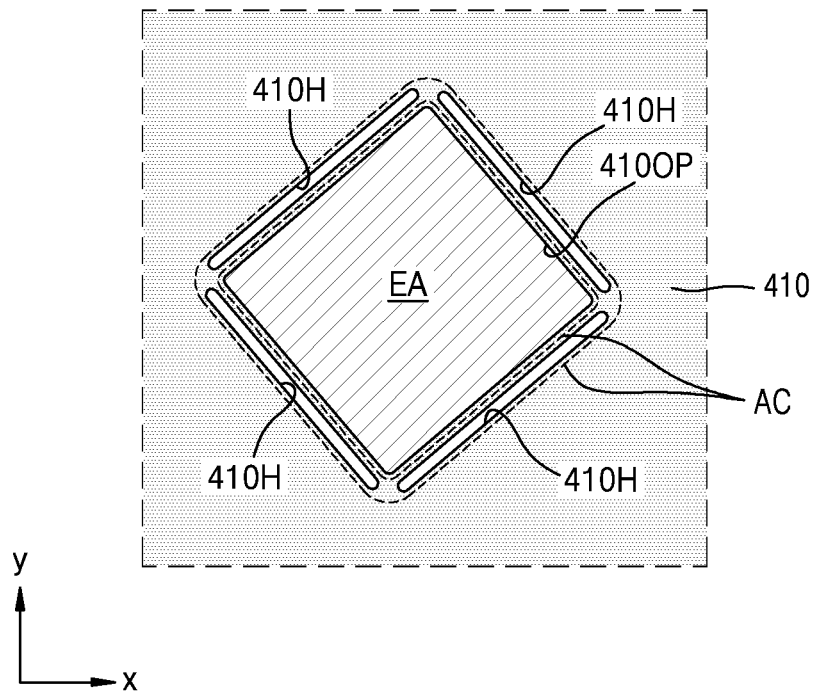
FIGS. 15A and 15B show plan views of a portion of a display device according to an embodiment.
Figure 15B:
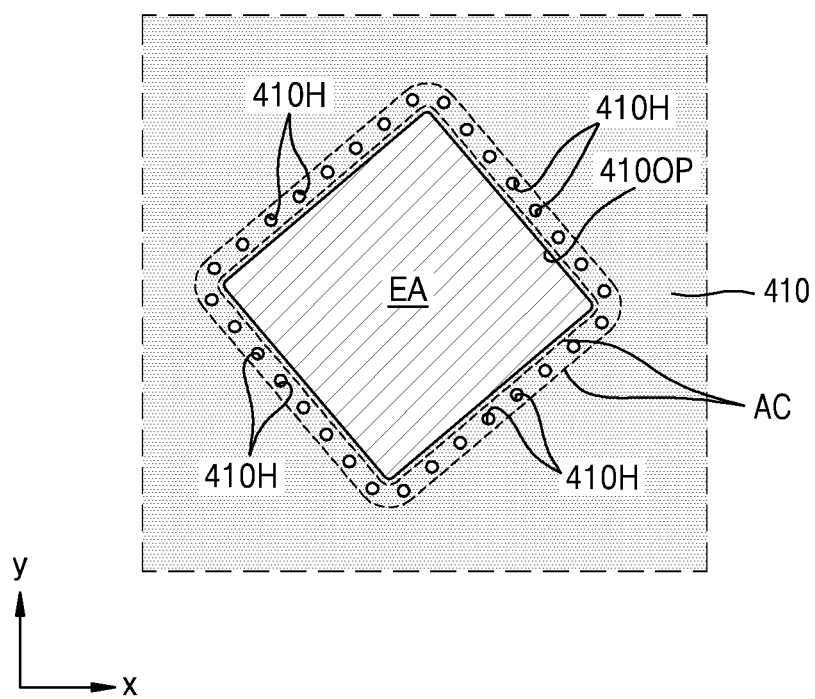

Referring to FIGS. 13, 15A and 15B, the air cavity AC may be arranged to be entirely around a periphery of the emission area EA so as to surround the emission area EA, and the air cavity AC may have a ring shape. An inner width W2 of the air cavity AC having a ring shape may be equal to or greater than the width W1 of the emission area EA. The holes 410H of the roof layer 410 may be apart from each other as shown in FIGS. 15A and 15B. For example, the 410H each having a slit shape may be spaced apart from each other along a side of the emission area EA (see FIG. 15A), or may be arranged to be entirely around a periphery of the emission area EA so as to surround the emission area EA (see FIG. 15B).

The intermediate layer 222 may include the emission layer 222b, and the emission layer 222b may overlap or face the opening 410OP of the roof layer 410. The first functional layer 222a may be arranged under the emission layer 222b, and the second functional layer 222c may be arranged on the emission layer 222b. The first functional layer 222a may include a hole transport layer and/or a hole injection layer, and the second functional layer 222c may include an electron injection layer and/or an electron transport layer.

Like the opposite electrode 223, the first functional layer 222a and/or the second functional layer 222c may be layers that entirely cover the substrate 100. There may be a small amount of a material layer Rm inside the air cavity AC, the material layer Rm including the same material as that of each of the first functional layer 222a, the second functional layer 222c, and the opposite electrode 223 provided on the roof layer 410 defining the air cavity AC. For example, as shown in FIG. 14, there may be a small amount of the material layer (i.e., material residue) Rm disposed inside the air cavity AC, the material layer Rm including a first material layer 222a', a second material layer 222c', and a third material layer 223', the first material layer 222a' including the same material as that of the first functional layer 222a, the second material layer 222c' including the same material as that of the second functional layer 222c, and the third material layer 223' including the same material as that of the opposite electrode 223.

The organic light-emitting diode OLED may be covered by the thin-film encapsulation layer 300, the organic light-emitting diode OLED including the pixel electrode 221, the intermediate layer 222, and the opposite electrode 223. The thin-film encapsulation layer 300 may include, for example, the first inorganic encapsulation layer 310, the organic encapsulation layer 320, and the second inorganic encapsulation layer 330. The first inorganic encapsulation layer 310 may be formed on the roof layer 410 and located on a top surface of the roof layer 410 and the lateral surfaces 410S of the roof layer 410 that define the hole 410H. A fourth material layer 310' may be located inside the air cavity AC as shown in FIG. 14, the fourth material layer 310' including the same material as that of the first inorganic encapsulation layer 310.

The organic encapsulation layer 320 may include a material in which a difference between a refractive index of the material and a refractive index of the air cavity AC may be equal to or greater than about 0.5 For example, the material may be an organic material having a refractive index ranging from about 1.5 to about 1.6. In a case where a difference between a refractive index of the organic encapsulation layer 320 and a refractive index of the air cavity AC meets the above-described range, a propagation path of light emitted from the organic light-emitting diode OLED may be changed. For example, the brightness of the display device may be effectively increased by more effectively changing a path of the light that may be emitted from the organic light-emitting diode OLED and which continually progresses obliquely with respect to the z and x directions to a path that is at least parallel with the z or thickness direction of the display device 10.

Figure 16:
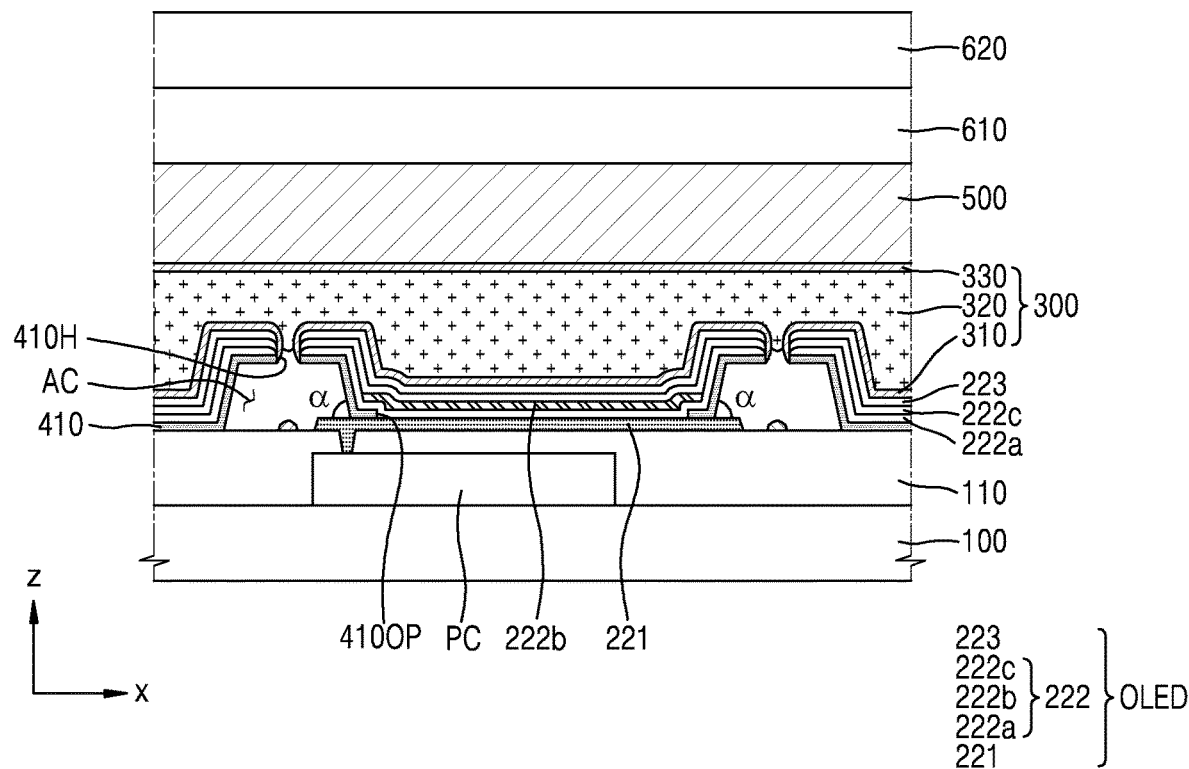
FIG. 16 shows a schematic cross-sectional view taken along line A-A' of FIG. 1 of a portion of a display device according to an embodiment.

FIG. 16 shows a schematic cross-sectional view of a portion of a display device according to another embodiment.

Referring to FIG. 16, the display device may further include the planarization layer 500 arranged on the thin-film encapsulation layer 300. The thin-film encapsulation layer 300 may be arranged on the air cavity AC. In other words, the thin-film encapsulation layer 300 may be arranged on the roof layer 410 that forms the air cavity AC. Since the thin-film encapsulation layer 300 may include the organic encapsulation layer 320, the organic encapsulation layer 320 may improve the flatness of the display device 10 by entirely covering elements thereunder. The planarization layer 500 may be further arranged on the thin-film encapsulation layer 300 and may further improve the flatness of the display device 10. The planarization layer 500 may prevent a member located on the planarization layer 500, for example, the touch input layer 610 and/or the optical functional layer 620, from being separated or detached from the display device.

Figure 17A:
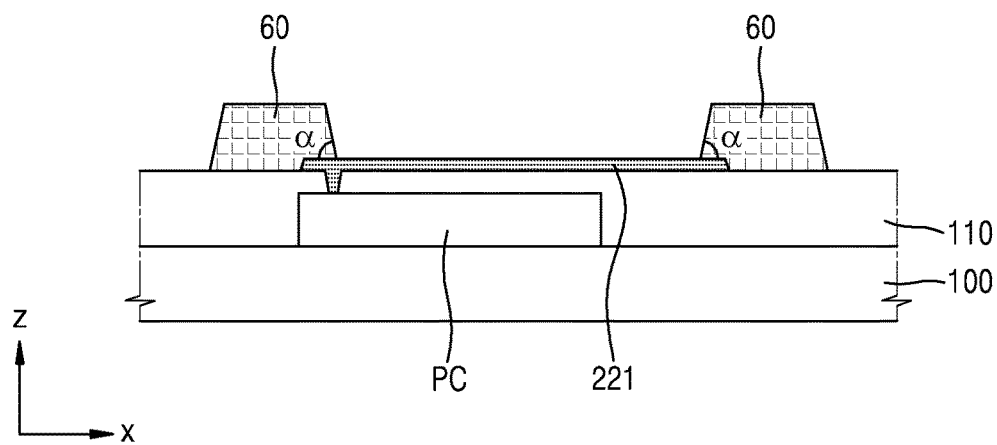
FIGS. 17A to 17F show schematic cross-sectional views taken along line A-A' of FIG. 1 of a process of manufacturing a display device according to an embodiment.
Figure 17B:
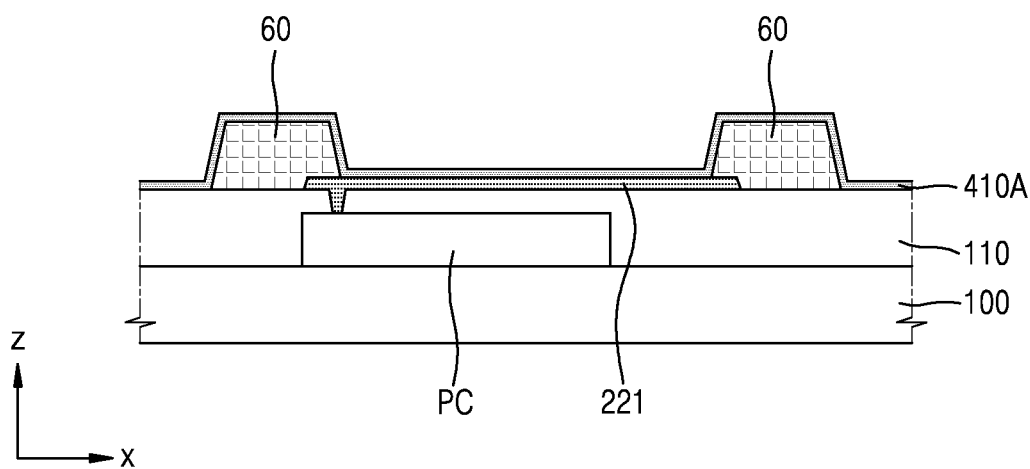
Figure 17C:
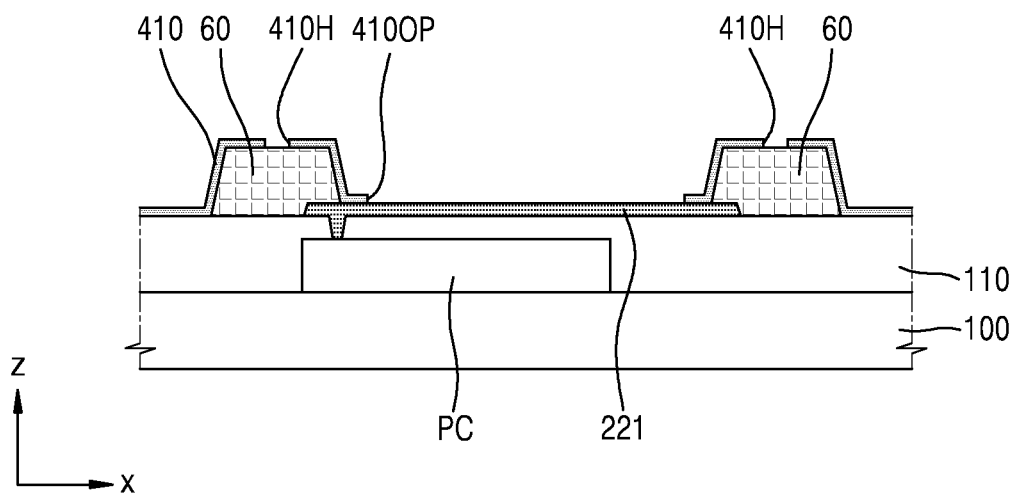
Figure 17D:
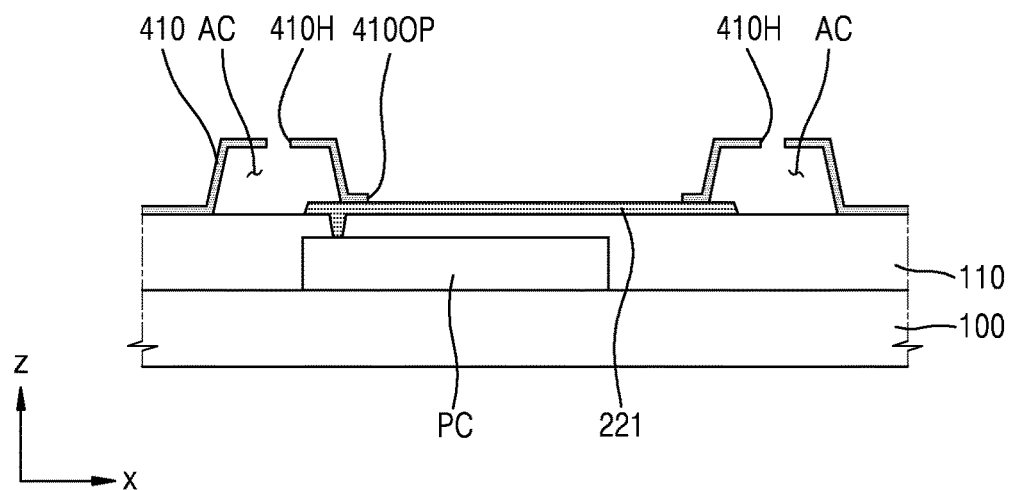
Figure 17E:
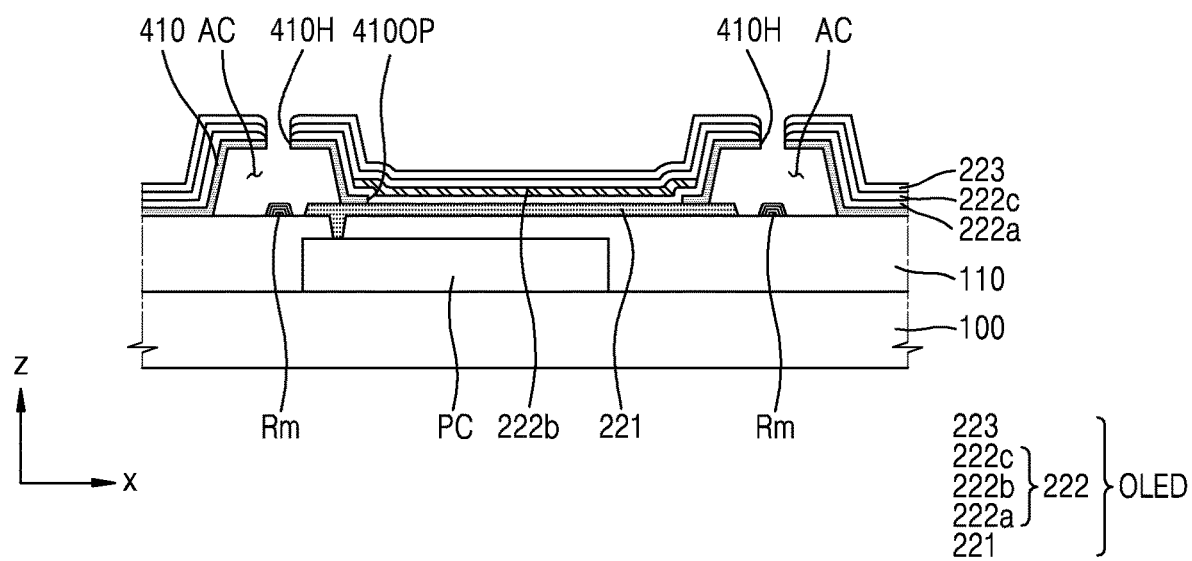
Figure 17F:
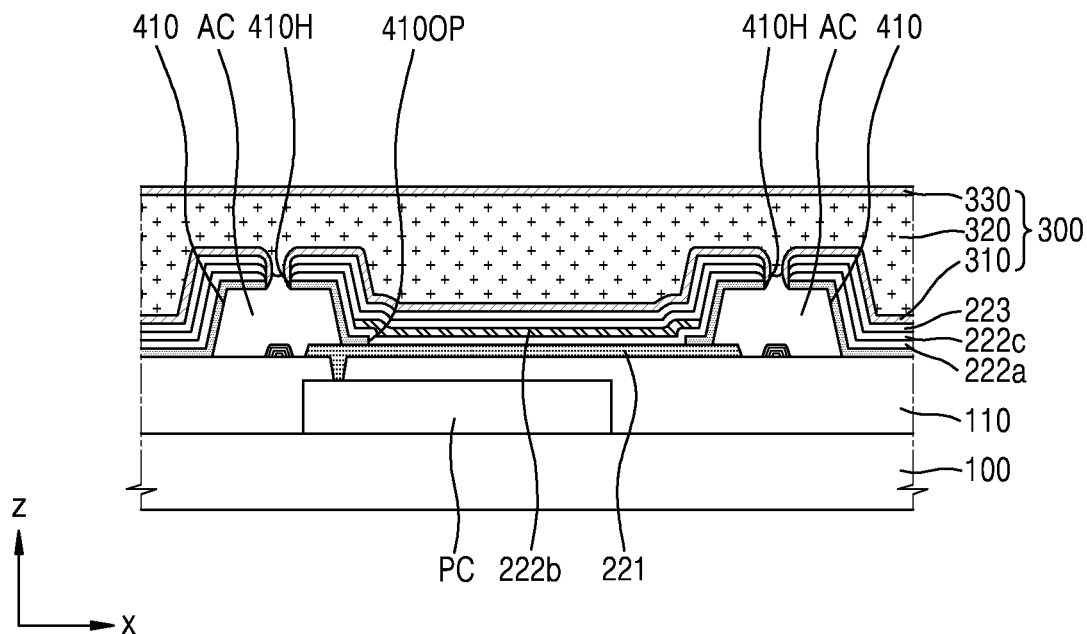
Figure 17G:
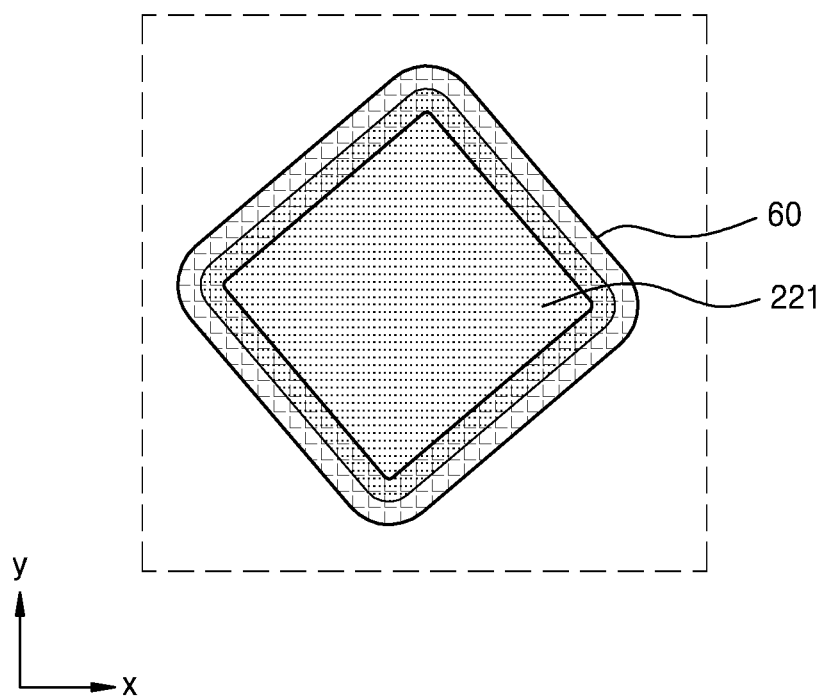
FIG. 17G shows a plan view of FIG. 17A.

FIGS. 17A to 17F show schematic cross-sectional views of a process of manufacturing a display device, according to another embodiment, and FIG. 17G shows a plan view of FIG. 17A.

Referring to FIG. 17A, the pixel circuit PC may be formed on the substrate 100, and the insulating layer 110 covering the pixel circuit PC may be formed thereon. The pixel electrode 221 may be formed to be electrically connected to the pixel circuit PC through a contact hole of the insulating layer 110.

The organic structure 60 may be formed. The organic structure 60 may be formed by forming a photosensitive organic material on the substrate 100 and then patterning the photosensitive organic material. As shown in FIG. 17G, the organic structure 60 may be entirely around a periphery of an edge of the pixel electrode 221 so as to surround an edge of the pixel electrode 221.

The organic structure 60 may have an inclined lateral surface. A cross-section of the organic structure 60 may have an approximate trapezoidal shape. An inclination angle α of the lateral surface of the organic structure 60 may be equal to or greater than about 50°. For example, the inclination angle α may be equal to or greater than about 60°.

Referring to FIG. 17B, the inorganic insulating layer 410A may be formed on the organic structure 60. The inorganic insulating layer 410A may be formed by CVD. The inorganic insulating layer 410A may include silicon nitride. The inorganic insulating layer 410A may include silicon oxide or silicon oxynitride. In an embodiment, a refractive index of the inorganic insulating layer 410A including silicon nitride may be adjusted by adjusting an amount of silicon thereof. For example, the refractive index of the inorganic insulating layer 410A may be about 1.7 to about 1.9.

The inorganic insulating layer 410A may be entirely formed over the substrate 100. The inorganic insulating layer 410A may directly contact a top surface and a lateral surface of the organic structure 60, and top surfaces of layers including the insulating layer 110 and the pixel electrode 221 arranged under the organic structure 60.

Referring to FIG. 17C, the roof layer 410 may be formed by patterning the inorganic insulating layer 410A. The roof layer 410 may include the hole 410H and the opening 410OP. Similar to the description made with reference to FIG. 6C, a process of patterning the roof layer 410 may be performed by using a mask and a photosensitive organic layer. The opening 410OP of the roof layer 410 may correspond to the emission area EA as described with reference to FIG. 13. The opening 410OP of the roof layer 410 may define the emission area EA.

As shown in FIG. 17D, the air cavity AC may be formed in a space in which the organic structure 60 may be disposed by removing the organic structure 60 through the hole 410H of the roof layer 410. As described with reference to FIG. 17G, since the organic structure 60 may be disposed around edges of the pixel electrodes so as to surround the edges of the pixel electrodes 221, the air cavity AC may also surround or be around the edges of the pixel electrode 221. The edge of the pixel electrode 221 may be covered by the roof layer 410 and located inside the air cavity AC.

Referring to FIG. 17E, the first functional layer 222a may be formed on the roof layer 410. The emission layer 222b may be formed on a location corresponding to the opening 410OP of the roof layer 410. The second functional layer 222c and the opposite electrode 223 may be sequentially formed on the emission layer 222b. The first functional layer 222a, the second functional layer 222c, and the opposite electrode 223 may be formed as one body so as to cover at least the display area DA.

The first functional layer 222a, the second functional layer 222c, and the opposite electrode 223 each may be formed by thermal evaporation. During a process of forming each of the first functional layer 222a, the second functional layer 222c, and the opposite electrode 223, materials constituting the above-described layer may be also located inside the air cavity AC through the hole 410H of the roof layer 410. FIG. 17E shows that the material layer Rm may be arranged to include the same materials as the first functional layer 222a, the second functional layer 222c, and the opposite electrode 223.

As shown in FIG. 17F, the first inorganic encapsulation layer 310, the organic encapsulation layer 320, and the second inorganic encapsulation layer 330 may be sequentially formed.

The first inorganic encapsulation layer 310 and the second inorganic encapsulation layer 330 may be formed by CVD and the first inorganic encapsulation layer 310 may be located on a top surface of the roof layer 410 and lateral surfaces of the roof layer 410 that define the hole 410H. During a process of forming the first inorganic encapsulation layer 310, there may be a small amount of a deposition material thereof inside the air cavity AC that may be disposed through the hole 410H. A specific structure thereof may be the same as that described with reference to FIG. 14. No material of the organic encapsulation layer 320, or a small amount thereof, may be disposed inside the air cavity AC via adjusting of the viscosity of an organic material constituting the organic encapsulation layer 320. The organic encapsulation layer 320 may be formed by coating a monomer and then hardening the monomer or coating a polymer.

Figure 18:
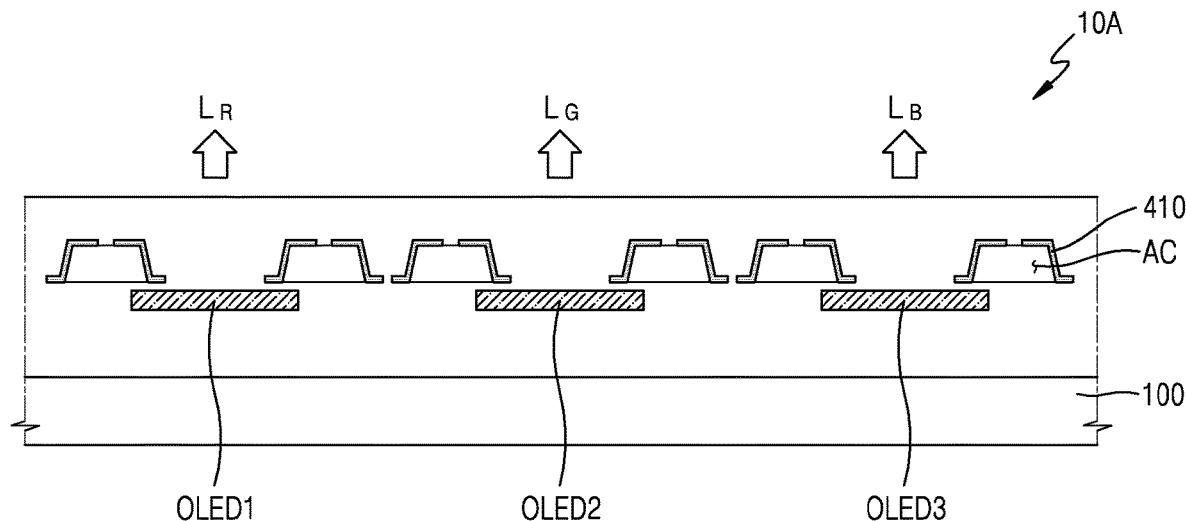
FIG. 18 shows a schematic cross-sectional view taken along line A-A' of FIG. 1 of a display device according to an embodiment.

FIG. 18 shows a schematic cross-sectional view of a display device 10A according to another embodiment.

Referring to FIG. 18, the display device 10A may emit pieces of light of different colors for each pixel. For example, a first organic light-emitting diode OLED1, a second organic light-emitting diode OLED2, and a third organic light-emitting diode OLED3 corresponding to respective pixels may be arranged over the substrate 100. The first organic light-emitting diode OLED1, the second organic light-emitting diode OLED2, and the third organic light-emitting diode OLED3 may emit lights of different colors, for example, red light $L_R$, green light $L_G$, and blue light $L_B$, respectively. The first organic light-emitting diode OLED1 may be located in a red pixel, the second organic light-emitting diode OLED2 may be located in a green pixel, and the third organic light-emitting diode OLED3 may be located in a blue pixel.

The red light $L_R$, the green light $L_G$, and the blue light $L_B$ respectively emitted from the first organic light-emitting diode OLED1, the second organic light-emitting diode OLED2, and the third organic light-emitting diode OLED3 may progress in a direction away from the substrate 100 and light that progresses obliquely may be totally reflected on an interface between the air cavity AC and the roof layer 410 and may progress approximately in the z-direction. For example, the light that progresses obliquely may be totally reflected from a side portion of the roof layer 410 that forms the air cavity AC.

The emission layer provided to each of the first organic light-emitting diode OLED1, the second organic light-emitting diode OLED2, and the third organic light-emitting diode OLED3 may include a low molecular weight organic material or a polymer organic material. The emission layer provided to each of the first organic light-emitting diode OLED1, the second organic light-emitting diode OLED2, and the third organic light-emitting diode OLED3 may include an organic material and/or a quantum dot.

With reference to FIG. 18, a specific structure for each pixel of the display device 10A may have a structure according to the embodiment(s) described with reference to FIGS. 3 to 17G and/or embodiments derived therefrom.

Figure 19:
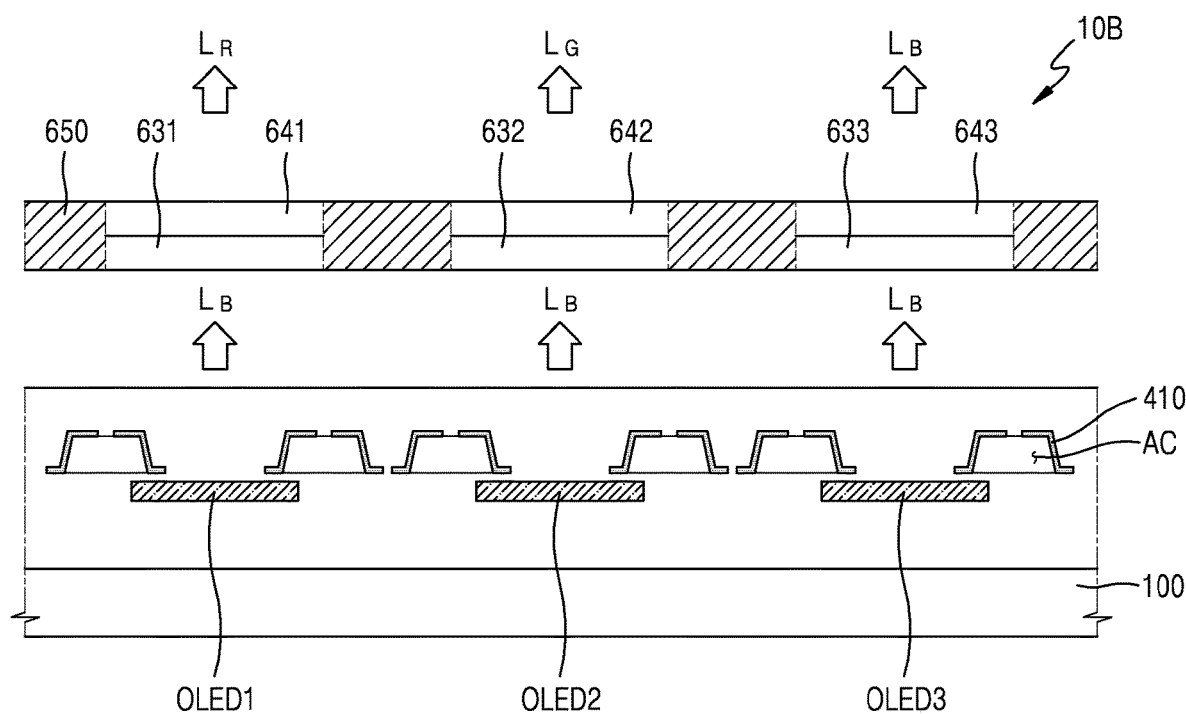
FIG. 19 shows a schematic cross-sectional view taken along line A-A' of FIG. 1 of a display device according to an embodiment.

FIG. 19 shows a schematic cross-sectional view of a display device 10B according to an embodiment.

Referring to FIG. 19, the display device 10B may include the first organic light-emitting diode OLED1, the second organic light-emitting diode OLED2, and the third organic light-emitting diode OLED3 corresponding to respective pixels, the first organic light-emitting diode OLED1, the second organic light-emitting diode OLED2, and the third organic light-emitting diode OLED3 emitting blue lights $L_B$.

The blue lights $L_B$ emitted from respective pixels may be respectively converted to red light $L_R$, green light $L_G$, and blue light $L_B$ while passing through a color conversion filter and a color filter located on a progression path of the light.

For example, blue light $L_B$ emitted from the first organic light-emitting diode OLED1 may be converted to red light by a first color converter 631 and color purity of the converted light may be improved while the converted light passes through a red color filter 641, and may be emitted to the outside. The first color converter 631 may include a quantum dot and a scattering particle. A quantum dot may have a core-shell structure including a core and a shell, the core including a nano crystal and the shell surrounding the core. A core of a quantum dot may include one of Group VI compound, Group III-V compound, Group IV-VI compound, Group IV element, Group IV compound, and a combination thereof.

Blue light $L_B$ emitted from the second organic light-emitting diode OLED2 may be converted to green light by a second color converter 632 and color purity of the converted light may be improved while the converted light passes through a green color filter 642, and may be emitted to the outside. The second color converter 632 may include a quantum dot and a scattering particle. A quantum dot may have a core-shell structure including a core and a shell, the core including a nano crystal and the shell surrounding the core. A core of a quantum dot may include one of Group II-VI compound, Group III-V compound, Group IV-VI compound, Group IV element, Group IV compound, and a combination thereof. A size and/or a structure of a quantum dot of the second color converter 632 may be different from a size and/or a structure of a quantum dot of the first color converter 631.

Blue light $L_B$ emitted from the third organic light-emitting diode OLED3 may pass through a transmissive area 633 and a blue color filter 643 and may be immediately emitted to the outside. The transmissive area 633 may include a scattering particle such as $TiO_2$.

A light-blocking portion 650 may be provided between two elements that neighbor each other among the first color converter 631, the second color converter 632, and the transmissive area 633, and/or two elements that neighbor each other among the red color filter 641, the green color filter 642, and the blue color filter 643. The light-blocking portion 650 may include a black matrix.

With reference to FIG. 19, a specific structure for each pixel of the display device 10A may have a structure according to the embodiment(s) described with reference to FIGS. 3 to 17G and/or embodiments derived therefrom.

A display device according to one or more embodiments may improve emission efficiency of light emitted from a display element, improve brightness, and extend the life of the display device.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display device, comprising:
   a substrate;
   a display element disposed on the substrate and including a pixel electrode, an opposite electrode, and an emission layer between the pixel electrode and the opposite electrode;
   a roof layer defining an air cavity, the air cavity being disposed around the display element; and
   a hole through a top surface of the roof layer, wherein
   a refractive index of the roof layer is greater than a refractive index of air defined by the air cavity.

2. The display device of claim 1, wherein
   the roof layer includes an inorganic insulating layer.

3. The display device of claim 2, wherein
   the roof layer includes at least one of silicon nitride, silicon oxide, or silicon oxynitride.

4. The display device of claim 3, wherein
   the roof layer includes a side portion inclined with respect to a main surface of the substrate.

5. The display device of claim 4, wherein
   an inclination angle of the side portion with respect to a plane parallel to the main surface of the substrate is equal to or greater than about 50°.

6. The display device of claim 1, wherein
   the roof layer includes more than one hole.

7. The display device of claim 1, further comprising:
   a thin-film encapsulation layer covering the display element and including at least one organic encapsulation layer and at least one inorganic encapsulation layer, wherein
   the at least one organic encapsulation layer has a refractive index greater than that of the air cavity.

8. The display device of claim 7, wherein
   the air cavity is located over the thin-film encapsulation layer.

9. The display device of claim 7, wherein
   the air cavity is located under the thin-film encapsulation layer.

10. The display device of claim 1, further comprising:
    a pixel-defining layer covering edges of the pixel electrode and including an opening corresponding to the pixel electrode, wherein
    the air cavity is located on the pixel-defining layer.

11. The display device of claim 1, wherein
    a portion of the air cavity overlaps edges of the pixel electrode.

12. The display device of claim 11, wherein
    the edges of the pixel electrode are located inside the air cavity.

13. The display device of claim 12, wherein
    the roof layer includes an opening having a width less than a width of the pixel electrode.

14. The display device of claim 1, wherein the roof layer is above and spaced apart from the substrate and the display element.

15. A display device, comprising:
    a substrate;
    a display element disposed on the substrate and including a pixel electrode, an opposite electrode, and an emission layer between the pixel electrode and the opposite electrode;

a roof layer defining an air cavity and including an inclined side portion, the inclined side portion being located on a propagation path of light that is emitted from the display element, and the inclined side portion defining an interface between the roof layer and the air cavity to change the propagation path of the light from a direction that is oblique with respect to a thickness direction of the substrate to a direction that is at least parallel with the thickness direction of the substrate; and a hole through a top surface of the roof layer, wherein a refractive index of the roof layer is greater than that of air defined by the air cavity.

16. The display device of claim 15, wherein the roof layer includes at least one hole.

17. The display device of claim 15, wherein the air cavity entirely surrounds the display element.

18. The display device of claim 15, wherein a difference between the refractive index of the roof layer and the refractive index of the air defined by the air cavity is equal to or greater than about 0.7.

19. The display device of claim 15, wherein the roof layer includes an inorganic insulating layer, and an inclination angle of the side portion with respect to a main surface of the substrate is equal to or greater than about 50°.

20. The display device of claim 15, wherein the roof layer includes an opening corresponding to the emission layer of the display element.

21. The display device of claim 20, further comprising:

a thin-film encapsulation layer covering the display element and including at least one organic encapsulation layer and at least one inorganic encapsulation layer, wherein a difference between a refractive index of the at least one organic encapsulation layer and a refractive index of the air defined by the air cavity is equal to or greater than about 0.5.

* * * * *